United States Patent
Ravimohan et al.

(10) Patent No.: US 10,275,170 B2
(45) Date of Patent: Apr. 30, 2019

(54) FOLDING OPERATIONS IN MEMORY SYSTEMS WITH SINGLE ADDRESS UPDATES

(71) Applicant: SanDisk Technologies LLC, Plano, TX (US)

(72) Inventors: Narendhiran Chinnaanangur Ravimohan, Bangalore (IN); Muralitharan Jayaraman, Bangalore (IN); Balakumar Rajendran, Bangalore (IN); Satya Kesav Gundabathula, Bangalore (IN); Ramkumar Ramamurthy, Bangalore (IN); Rohit Sathyanarayan, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/483,185

(22) Filed: Apr. 10, 2017

(65) Prior Publication Data

US 2018/0293014 A1    Oct. 11, 2018

(51) Int. Cl.
  *G06F 3/06*  (2006.01)
  *G11C 16/10*  (2006.01)
  *G11C 16/30*  (2006.01)
  *G11C 16/34*  (2006.01)

(52) U.S. Cl.
  CPC ............ G06F 3/0631 (2013.01); G06F 3/061 (2013.01); G06F 3/0626 (2013.01); G06F 3/0653 (2013.01); G06F 3/0679 (2013.01); G11C 16/10 (2013.01); G11C 16/30 (2013.01); G11C 16/3459 (2013.01)

(58) Field of Classification Search
  CPC .................................................. G06F 12/0246
  See application file for complete search history.

(56) References Cited

U.S. PATENT DOCUMENTS

| 8,144,512 | B2 * | 3/2012 | Huang | G06F 12/0246 365/185.03 |
| 8,886,877 | B1 | 11/2014 | Avila et al. | |
| 2008/0104309 | A1 * | 5/2008 | Cheon | G06F 12/0246 711/103 |
| 2015/0179267 | A1 | 6/2015 | Srinivasan et al. | |

* cited by examiner

*Primary Examiner* — Edward J Dudek, Jr.
(74) *Attorney, Agent, or Firm* — Dickinson Wright PLLC

(57) ABSTRACT

A memory system may be configured to perform immediate folding of data from a low storage density area to a high storage density area. A low storage density target area may be monitored, and when a capacity of the low storage density target area reaches a threshold level, data stored in the low storage density target area may be folded to an associated high storage density target area. The memory system may utilize a pointer system to manage the folding of data. The pointer system may also be utilized for read operations in order to avoid updating address mapping tables for both the low storage density and the high storage density areas.

17 Claims, 17 Drawing Sheets

| Logical Group | LGi | 0 | 1 | ... | m | m+1 | ... | M-1 |

| Physical Group (Metablock) | MBj | 0 | 1 | ... | n | n+1 | ... | N-1 |
| | MBj | m | m+1 | ... | M-1 | 0 | 1 | ... | m-1 |

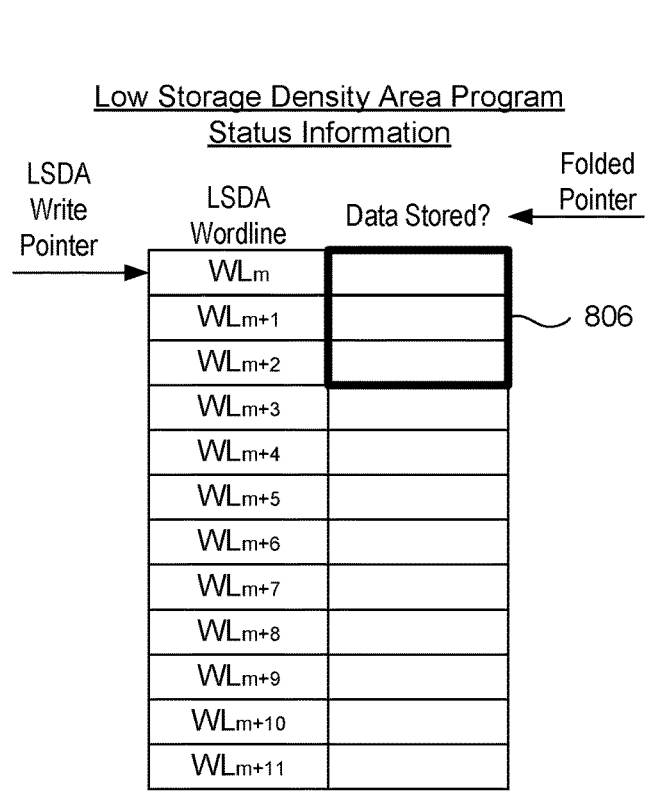
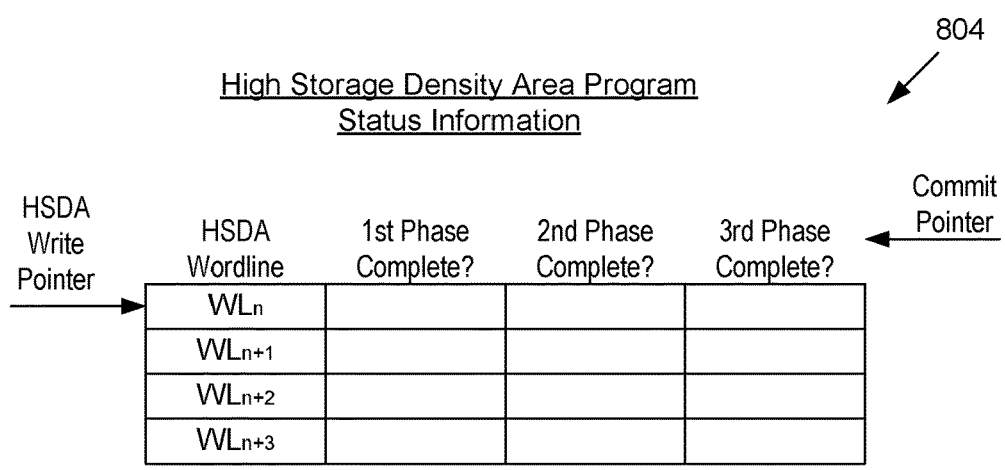
FIG. 8A

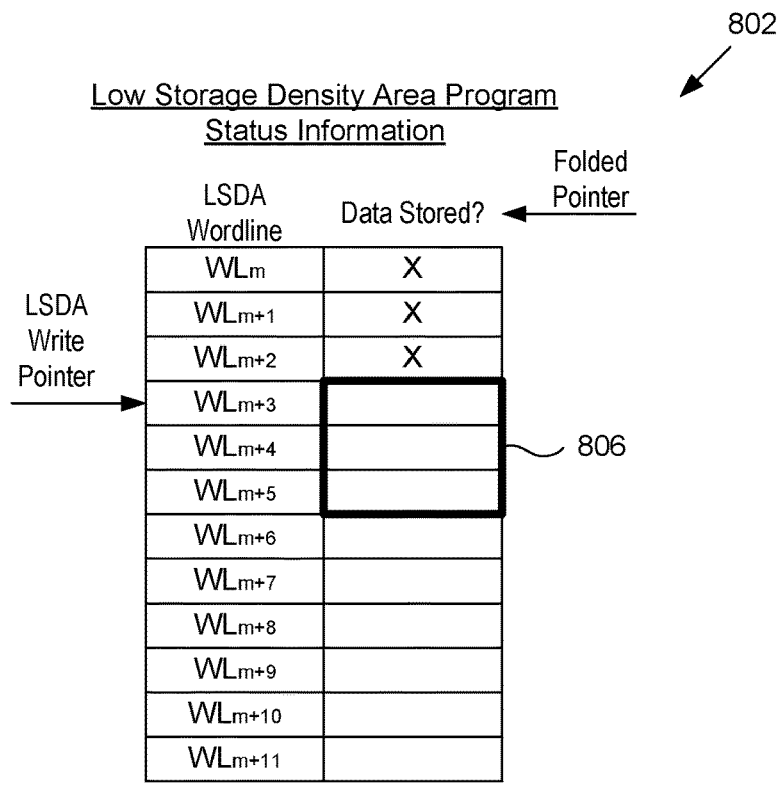
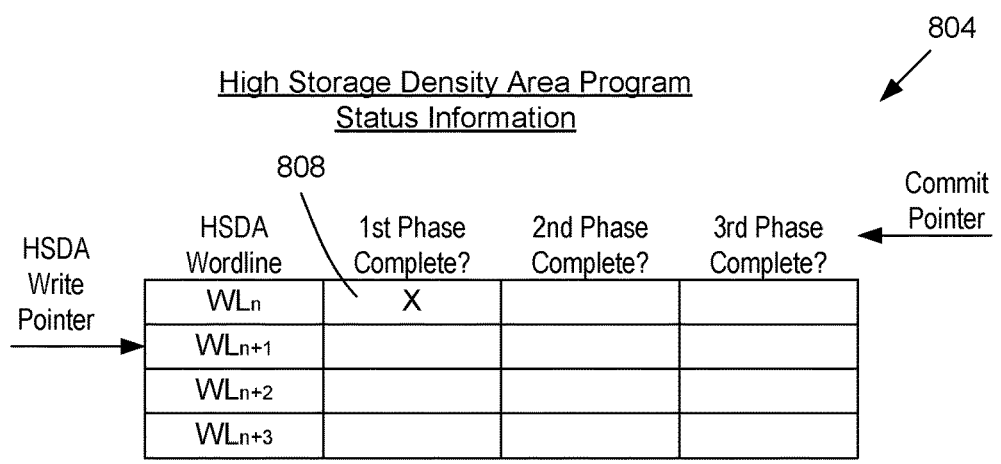
FIG. 8B

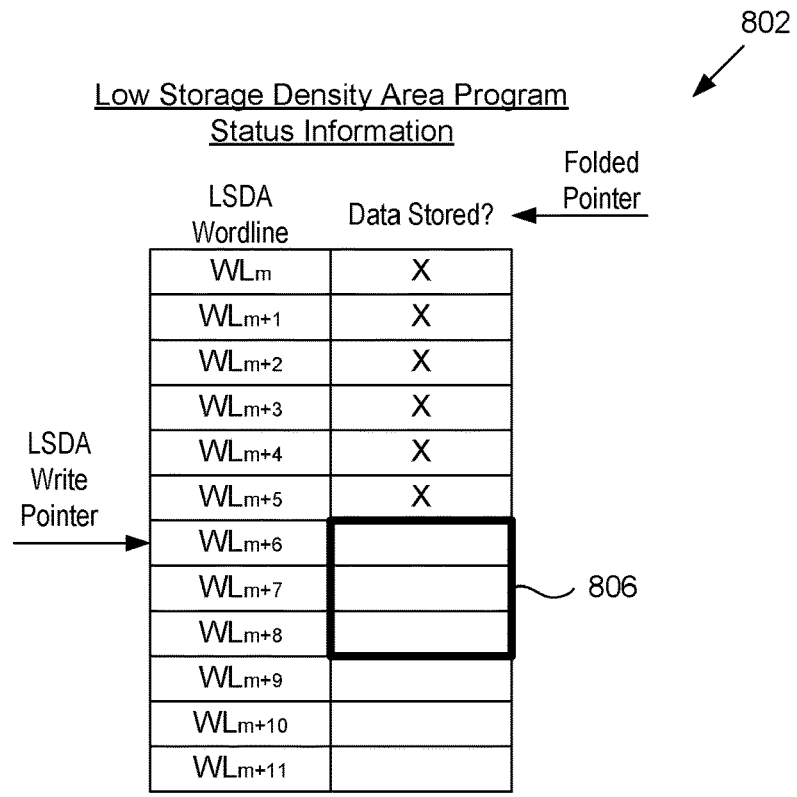
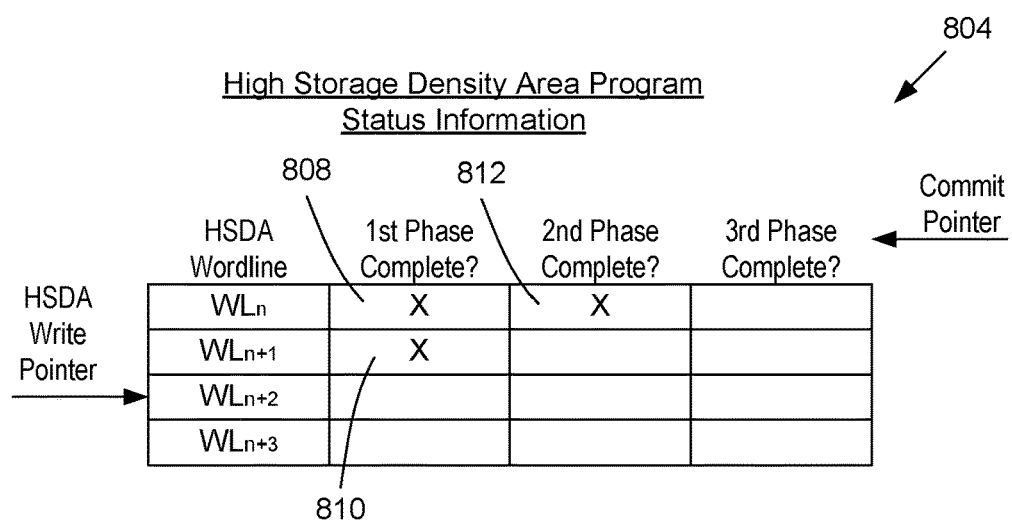
FIG. 8C

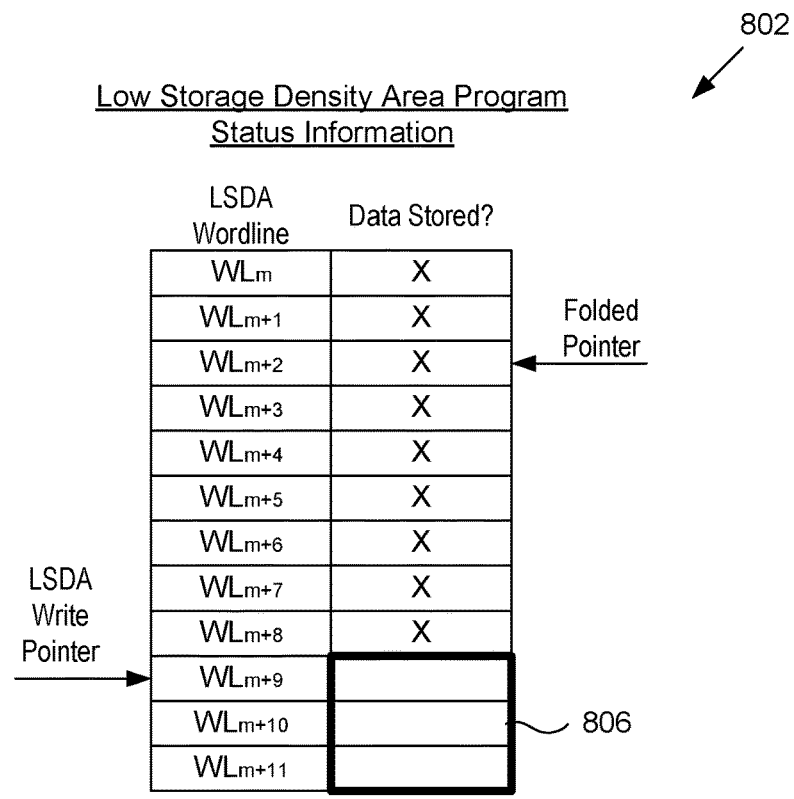
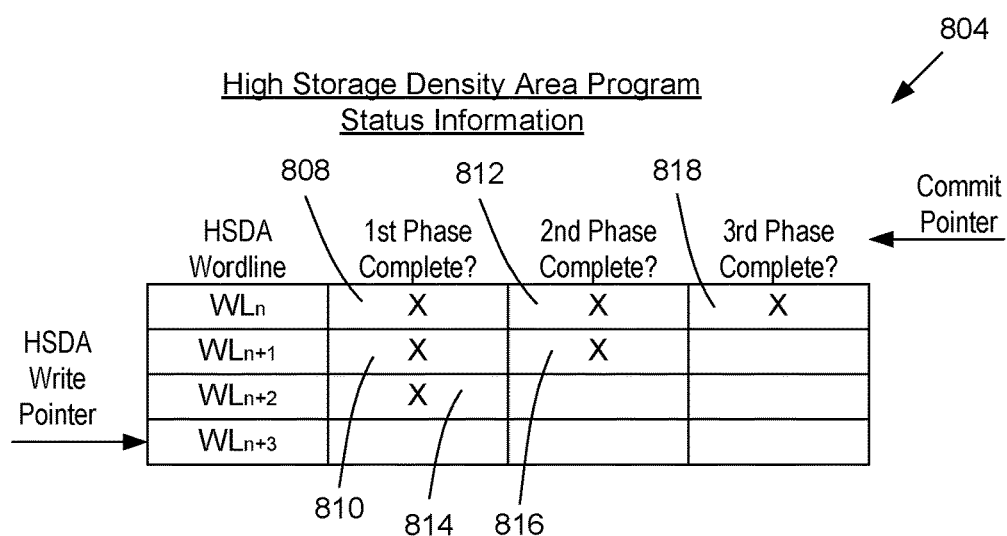
FIG. 8D

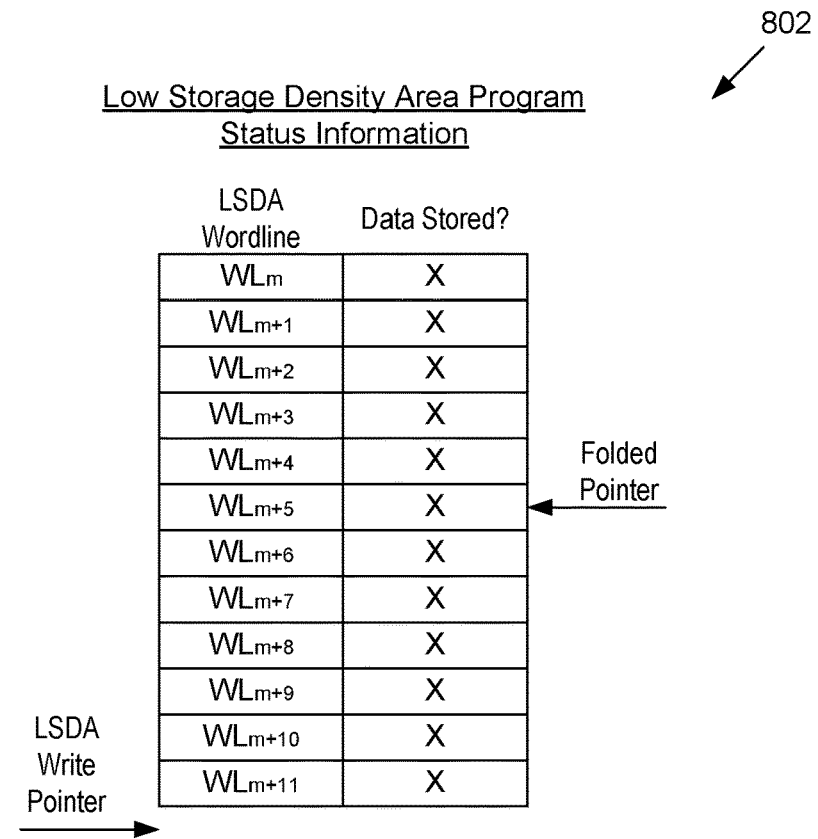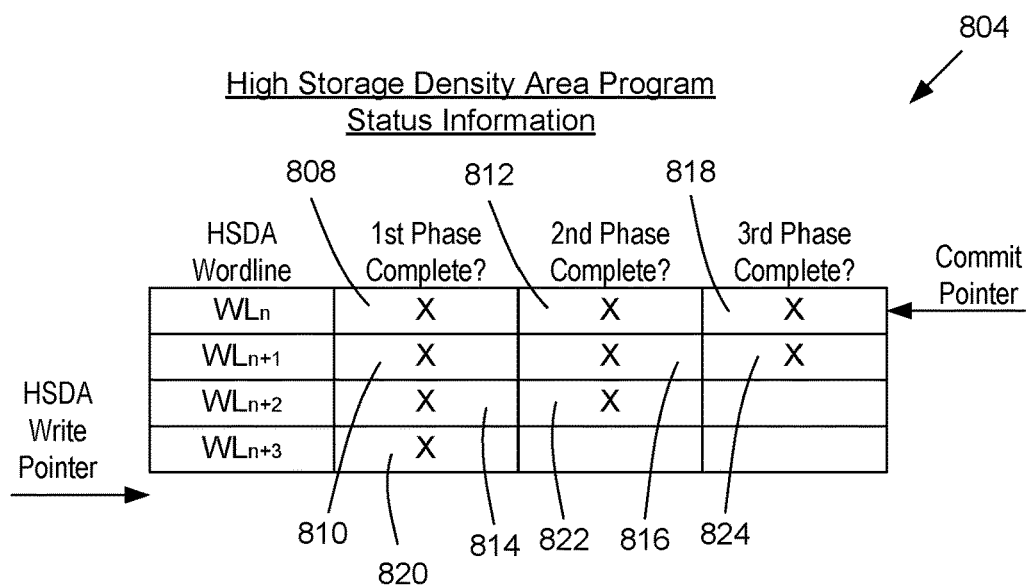
FIG. 8E

Low Storage Density Area Program Status Information

802

| LSDA Wordline | Data Stored? | |
|---|---|---|
| WLm | DP1 | |
| WLm+1 | DP2 | |
| WLm+2 | DP3 | |
| WLm+3 | DP4 | |
| WLm+4 | DP5 | |
| WLm+5 | DP6 | ← Folded Pointer |
| WLm+6 | DP7 | |
| WLm+7 | DP8 | |
| WLm+8 | DP9 | |
| WLm+9 | DP10 | |
| WLm+10 | DP11 | |
| WLm+11 | DP12 | |

High Storage Density Area Program Status Information

804

| HSDA Wordline | 1st Phase Complete? | 2nd Phase Complete? | 3rd Phase Complete? | |
|---|---|---|---|---|
| WLn | DP1 | DP2 | DP3 | ← Commit Pointer |
| WLn+1 | DP4 | DP5 | DP6 | |
| WLn+2 | DP7 | DP8 | DP9 | |
| WLn+3 | DP10 | DP11 | DP12 | |

FIG. 10

FOLDING OPERATIONS IN MEMORY SYSTEMS WITH SINGLE ADDRESS UPDATES

BACKGROUND

Memory systems may be configured to store data in different areas of a memory according to different storage densities, or number of bits per cell. Single-level cells (SLC) may be configured to store one bit per cell, and multiple-level cells (MLC) may be configured to store multiple bits per cell. When a memory system receives data from a host system, the data may be initially stored in a memory area designated for SLC data storage. After a certain period of time has elapsed, the memory system may determine to move the data to a different memory area designated for MLC data storage. This process of moving data from an SLC memory area to a MLC memory area may be referred to as a folding operation.

In addition, memory systems utilize address data structures to identify where data is being stored in the memory. For a given data set that is folded to the MLC memory area, a memory system may make at least two updates to an address data structure that is associated with the folded data set—a first update to identify where in the SLC memory area the data set is stored, and a second update to identify where in the MLC memory area the data set is stored. Further, since a certain time period elapses before data is folded to the MLC memory area, a relatively large amount of storage capacity may be designated for the SLC memory area to ensure that there is a sufficient amount of SLC storage for data to be initially stored. Ways to fold data from an SLC memory area to an MLC area that allow for a single update to the address data structure and that reduces the size of the SLC storage area may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 8A is a schematic diagram of a pair of tables that show statuses of folding operations to fold a plurality of data sets to a high storage density area of memory, where the data sets have not yet been stored in a low storage density storage area.

FIG. 8B is a schematic diagram of the pair of tables of FIG. 8A, showing a first data set stored in the low storage density area and a first phase of a first programming operation performed to store the first data set in the high storage density area.

FIG. 8C is a schematic diagram of the pairs of tables of FIGS. 8A and 8B, showing a second data set stored in the low storage density area, a first phase of a second programming operation performed to store the second data set in the high storage density area, and a second phase of the first programming operation performed.

FIG. 8D is a schematic diagram of the pairs of tables of FIGS. 8A, 8B, and 8C showing a third data set stored in the low storage density area, a first phase of a third programming operation performed to store the third data set in the high storage density area, a second phase of the second programming operation performed, and a third phase of the first programming operation performed.

FIG. 8E is a schematic diagram of the pairs of tables of FIGS. 8A, 8B, 8C, and 8D showing a fourth data set stored in the low storage density area, a first phase of a fourth programming operation performed to store the fourth data set in the high storage density area, a second phase of the third programming operation performed, and a third phase of the second programming operation performed.

FIG. 10 is a schematic diagram of pairs of tables showing various data pages being stored in both the low storage density and the high storage density area.

DETAILED DESCRIPTION

Overview

Figure 1A:
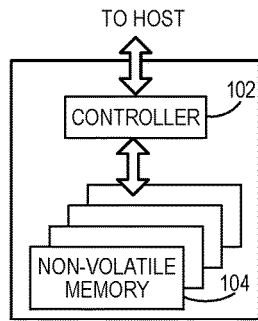
FIG. 1A is a block diagram of an exemplary non-volatile memory system.

By way of introduction, the below embodiments relate to memory systems and methods for identifying a deviation of a particular memory location's response compared to an expected or estimated response as indicated by a BER model. In one embodiment, a memory and a controller. The memory includes a first memory area and a second memory area, where the first memory area includes a lower storage density than the second memory area. The controller is configured to: program a data set into a storage location of the first memory area that is to be stored in a storage location of the second memory area, where the storage location of the first memory area and the storage location of the second memory area are equal in storage capacity. In response to all of the data set being stored in the storage location of the first memory area, perform an initial phase of a write operation on the storage location of the second memory area to store the data set in the storage location of the second memory area.

In some embodiments, the controller is configured to wait to perform a next phase of the write operation until all of a next data set is programmed into a next storage location of the first memory area.

In some embodiments, the storage location of the first memory area includes a first storage location of the first memory area, the storage location of the second memory area includes a first storage location of the second memory area, the data set includes a first data set, the write operation includes a first write operation, and the controller is configured to: program a second data set into a second storage location of the first memory area that is to be stored in a second storage location of the second memory area, where the second storage location of the first memory area and the second storage location of the second memory area are equal in storage capacity. In response to all of the second data set being stored in the second storage location of the first memory area: perform a first phase of a second write operation to store the second data set in the second storage location of the second memory area; and perform a second phase of the first write operation to store the first data set in the first storage location of the second memory area.

In some embodiments, the controller is configured to: determine a third storage location of the first memory area and a third storage location of the second memory area in which to store a third data set, where the third storage location of the first memory area and the third storage location of the second memory area are equal in storage capacity. In response to a determination that the third storage location of the first memory area is storing all of the third data set: perform a first phase of a third write operation to store the third data set in the third storage location of the second memory area; perform a second phase of the second write operation to store the second data set in the second storage location of the second memory area; and perform a third phase of the first write operation to store the first data set in the first storage location of the second memory area.

In some embodiments, the controller is configured to, before performing a third phase of the third write operation to store the third data set in the third storage location of the second memory, perform a commit operation to commit the first data set and perform a third phase of the second write operation to storage the second data set in the second storage location of the second memory area.

In some embodiments, the first storage location of the second memory area, the second storage location of the second memory area, and the third storage location of the second memory area are adjacent storage locations of the second memory area.

In some embodiments, the first memory area and the second memory area are each partitioned into a first data type portion associated with a first data type and a second data type portion associated with a second data type. In addition, the controller is configured to: identify the data set as being of the first data type or of the second data type; determine that the storage location of the first memory area and the storage location of the second memory area are in the respective first data type portions in response to an identification that the data is of the first data type; and determine that the storage location of the first memory area and the storage location of the second memory area in the respective second data type portions in response to an identification that the data is of the second data type.

In some embodiments, the storage location of the second memory area is a single storage page.

In another embodiment, a folding method is performed. The method includes: monitoring, with a controller of a system, an amount of data being stored in a storage location of a low storage density memory area of the memory system; determining, with the controller, that the amount of data has reached a threshold level; and in response to the determining, outputting, with power control circuitry, an initial series of pulses of a first programming operation to program the amount of data in a storage location of a high storage density memory area of the memory system.

In some embodiments, the storage location of the low storage density memory area includes a first storage location of the low storage density memory area, the storage location of the high storage density memory area includes a first storage location of the high storage density memory area, the amount of data set includes a first amount of data, the initial series of pulses includes a first initial series of pulses, and the method includes: monitoring, with the controller, a second amount of data being stored in a second storage location of the low storage density memory area of the memory system; in response to the controller determining that the second amount of data has reached the threshold level: outputting, with the power control circuitry, an initial series of pulses of a second programming operation to program the second amount of data in a second storage location of the high storage density memory area; and outputting, with the power control circuitry, a second series of pulses of the first programming operation to program the first amount of data in the first storage location of the high storage density memory area.

In some embodiments, the method includes: monitoring, with the controller, a third amount of data being stored in a third storage location of the low storage density memory area of the memory system; in response to the controller determining that the third amount of data has reached the threshold level: outputting, with the power control circuitry, an initial series of pulses of a third programming operation to program the third amount of data in a third storage location of the high storage density memory area; outputting, with the power control circuitry, a second series of pulses of the second programming operation to program the second amount of data in the second storage location of the high storage density memory area; and outputting, with the power control circuitry, a third series of pulses of the first programming operation to program the first amount of data in the second storage location of the high storage density memory area.

In some embodiments, the first storage location of the second memory area, the second storage location of the second memory area, and the third storage location of the second memory area are adjacent storage locations of the second memory area.

In some embodiments, the storage location is a single page of the high storage density memory area.

In another embodiment, a memory system includes a memory and a controller. The memory includes a first memory area and a second memory area, where the first memory area includes a lower storage density than the second memory area. The controller is configured to: program a data set into the first memory area and the second memory area; and update an address data structure to identify the data set as being stored in the second memory area but not the first memory area.

In some embodiments, the controller is configured to receive a read request to read the data set from the memory; and in response to receipt of the request: determine whether the data set stored in the second memory area is committed or uncommitted; in response to a determination that the data set stored in the second memory area is committed, read the data set from the second memory area; and in response to a determination that the data set stored in the second memory area is uncommitted, read the data set from the first memory area.

In some embodiments, the controller is configured to identify where the data set is stored in the second memory area relative to a second memory area address to which a commit pointer is pointing in an address database in order to determine whether the data set stored in the second memory area is verified.

In some embodiments, the commit pointer points to an address of the second memory area where a last committed data set is stored.

In some embodiments, the data set includes a first data set, and the controller, in response to the determination that the first data set is uncommitted, is configured to identify where the first data set is stored in the second memory in relation to where a second data set is stored in the second memory area. The second data set is identified as a last data set to have been programmed in the second memory with a last phase of a multi-phase programming operation.

In some embodiments, the controller is configured to point a folded pointer to an address where the second data is stored in the second memory area in response to the last phase of the multi-phase programming operation being performed.

In some embodiments, the controller is further configured to program a third data set into the second memory area, and before performing a last phase of a multi-phase programming operation to program the third data set into the memory area, perform a commit operation to commit the first data set and perform the last phase of the multi-phase programming operation to program the second data set into the memory operation.

In another embodiment, a memory system includes: a memory including a first memory area and a second memory area, where the first memory area includes a lower storage density than the second memory area; means for programming a data set into a storage location of the first memory area that is to be stored in a storage location of the second memory area, the storage location of the first memory area and the storage location of the second memory area being equal in storage capacity; and means for performing an initial phase of a write operation on the storage location of the second memory area to store the data set in the storage location of the second memory area in response to all of the data set being stored in the storage location of the first memory area.

Other embodiments are possible, and each of the embodiments can be used alone or together in combination. Accordingly, various embodiments will now be described with reference to the attached drawings.

Embodiments

The following embodiments describe non-volatile memory systems and related methods for immediate folding of data into high density storage to allow for single updates of an address mapping database. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory die(s) 104, the subject matter described herein is not limited to having a single memory channel. For example, in some NAND memory system architectures, 2, 4, 8 or more NAND channels may exist between the controller and the NAND memory die(s) 104, depending on controller capabilities. In any of the embodiments described herein, more than a single channel may exist between the controller and the memory die(s)s 104, even if a single channel is shown in the drawings.

Figure 1B:
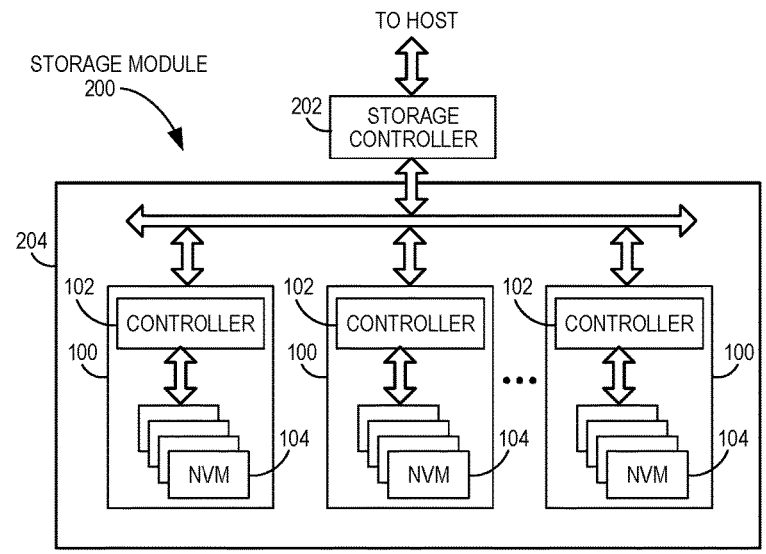
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
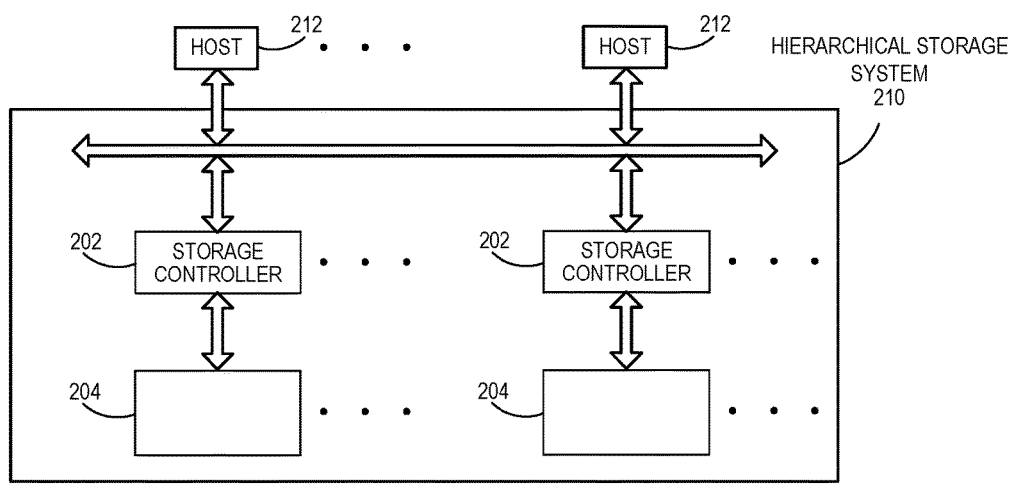
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
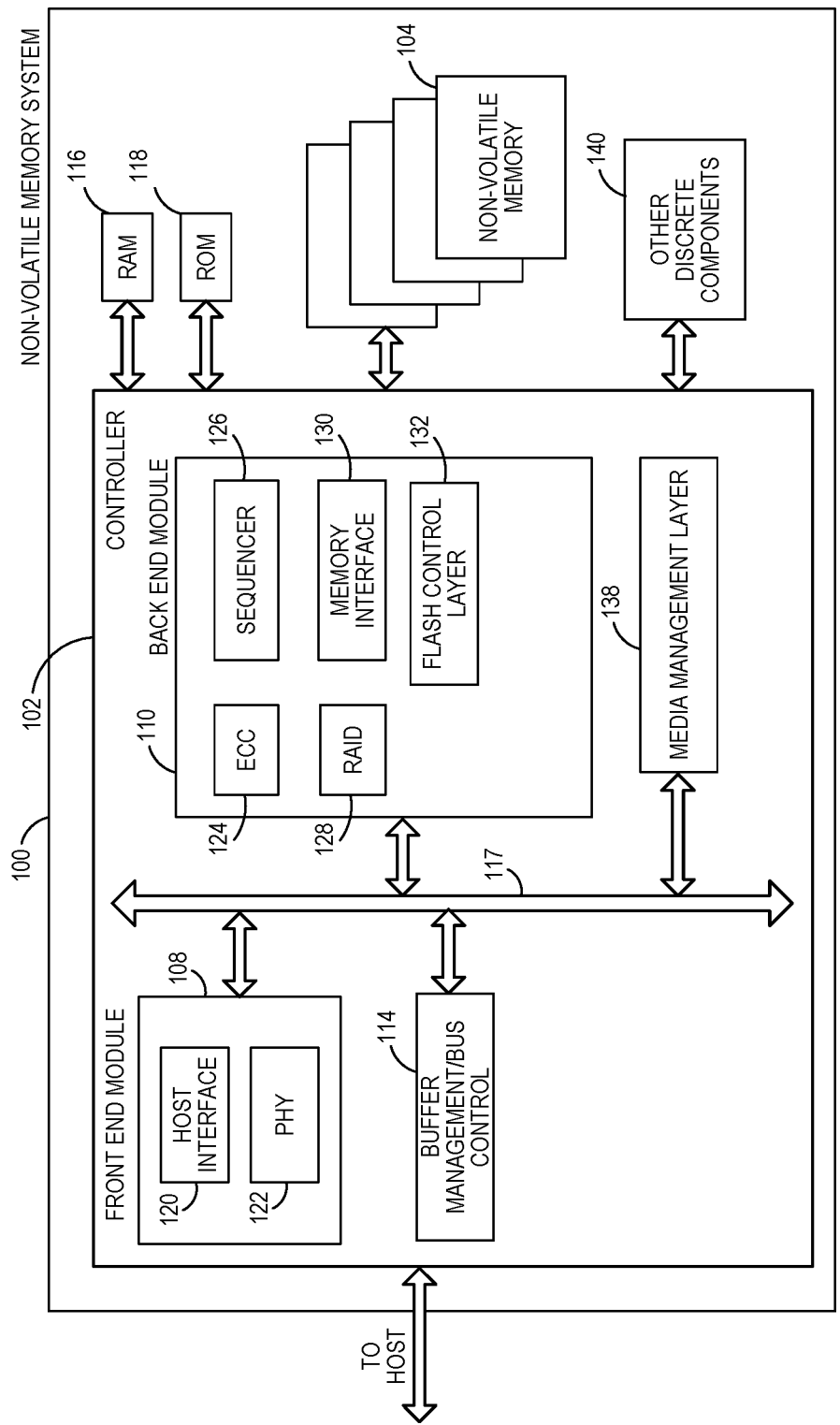
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
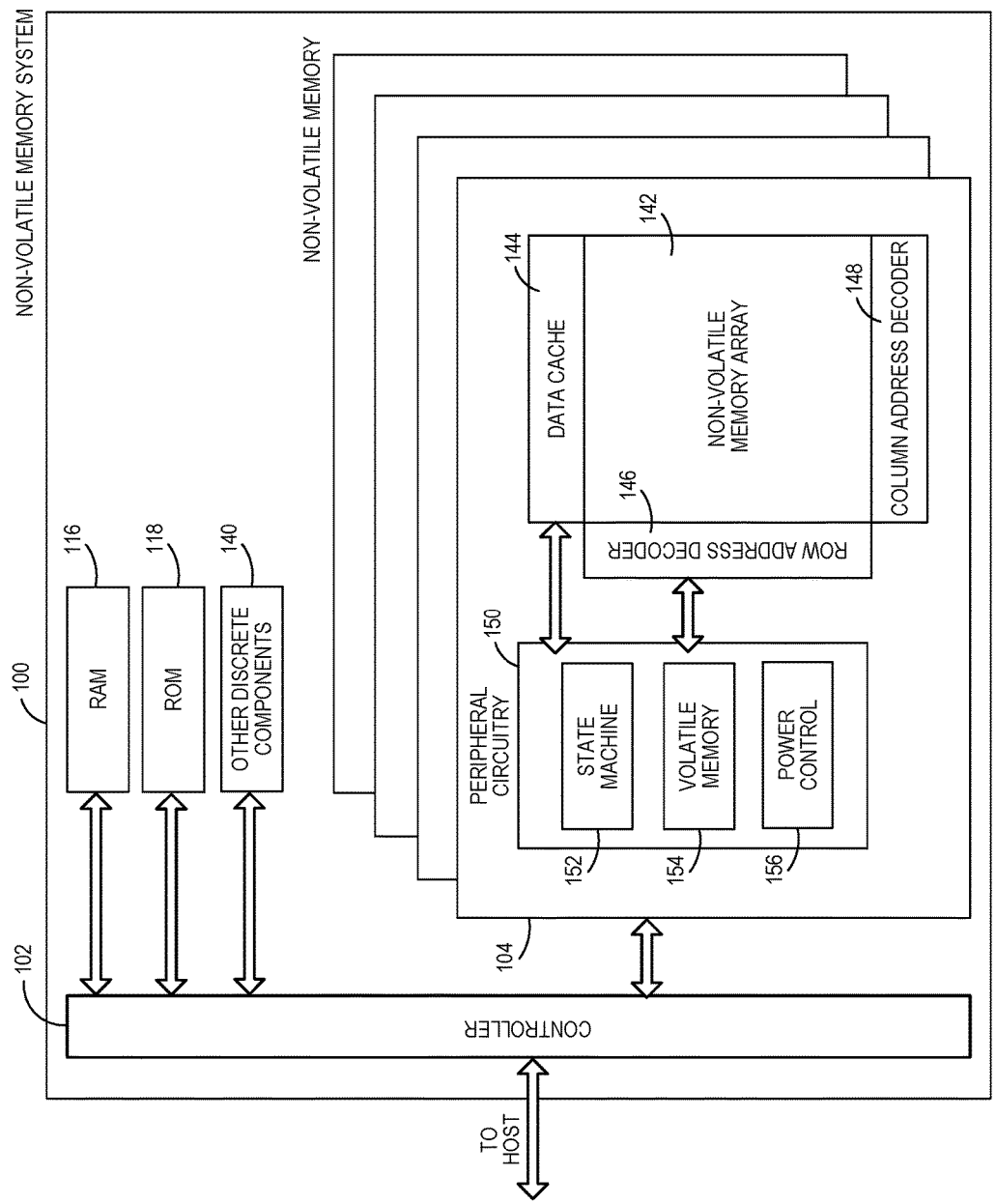
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured or programmed as single-level cells (SLCs) that store a single bit of data per cell, multi-level cells (MLCs) that store multiple bits of data per cell, or combinations thereof. Example multi-level cells may be configured or programmed to store 2-bits per cell, 3-bits per cell, 4-bits per cell, or more. As used herein, an MLC configured or programmed to store 2-bits per cell may be referred to as a 2×MLC, an MLC configured or programmed to store 3-bits per cell may be referred to as a 3×MLC, an MLC configured or programmed to store 4-bits per cell may be referred to as a 4×MLC, or more generally, an MLC configured or programmed to store Q-bits per cell may be referred to as a QX MLC, where Q is an integer of 2 or more.

Additionally, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a memory cell (e.g., a FGT). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
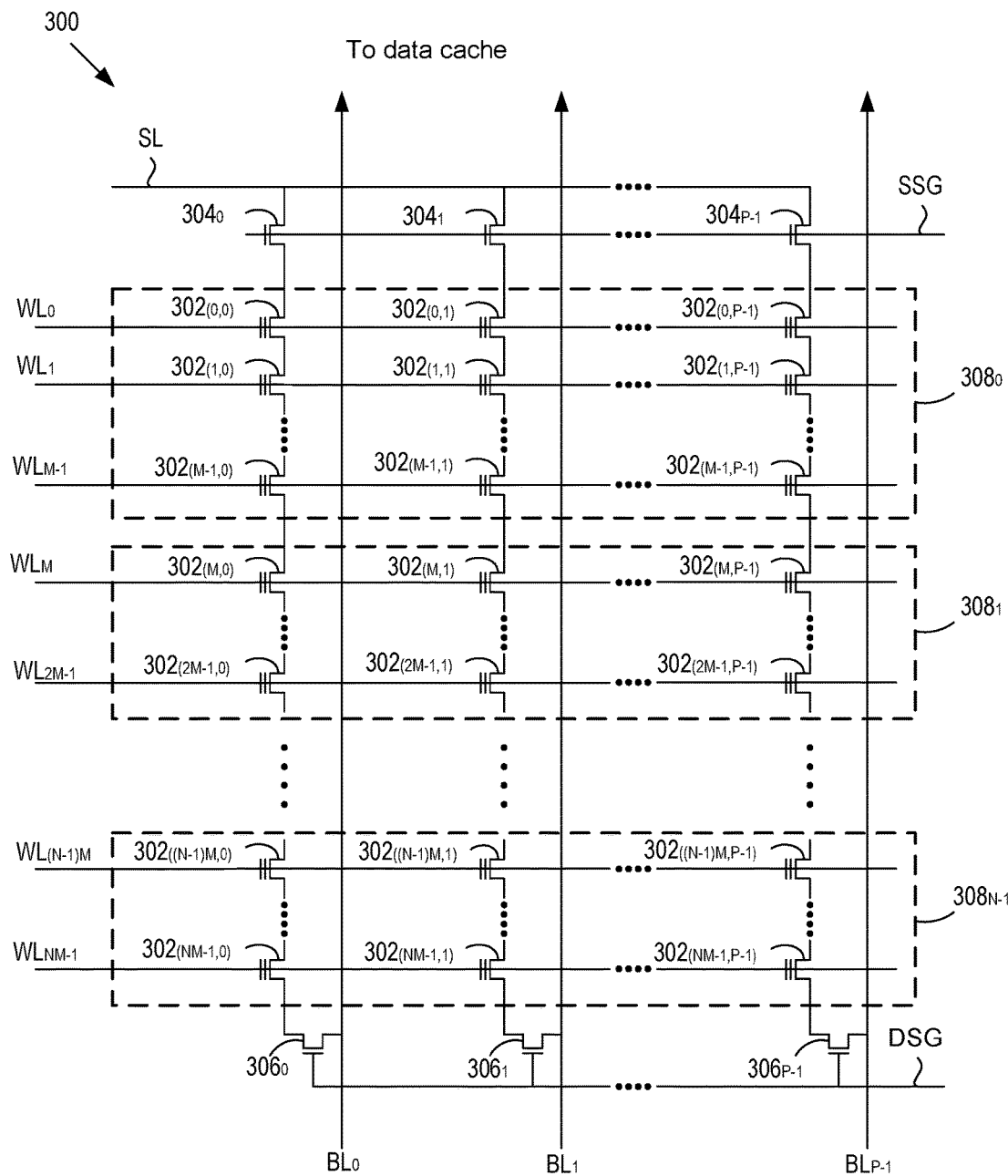
FIG. 3 is a circuit schematic diagram of an exemplary NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled. Switching of source select transistors $304_0$, $304_1, \ldots, 304_{P-1}$ may be controlled using a source select gate bias line SSG that supplies a source select gate bias voltage $V_{SSG}$ to turn on an off the source select transistors $304_0, 304_1, \ldots, 304_{P-1}$. Additionally, switching of drain select transistors $306_0, 306_1, \ldots, 306_{P-1}$ may be controlled using a drain select gate bias line DSG that supplies a drain select gate bias voltage $V_{DSG}$ to turn on and off the drain select TRANSISTORS $306_0, 306_1, \ldots, 306_{P-1}$.

To program a memory cell, a program voltage is applied to the control gate of the storage element, and the bitline BL associated with the memory cell is grounded. Electrons from the channel are injected into the floating gate of the memory cell. Doing so may cause electrons to accumulate in the floating gate, which in turn may cause the floating gate to become negatively charged and the threshold voltage of the memory cell to be raised. To apply the program voltage to the control gate of the memory cell being programmed, the program voltage is applied on the wordline WL to which the memory cell is coupled. Application of the program voltage may include applying a series or sequence of programming voltage pulses to the control gate of the memory cell being programmed via the wordline WL. In some example configurations, the series of programming voltage pulses may have increasing magnitudes, starting with an initial pulse of the series having an initial program voltage magnitude. As discussed above, one memory cell in each of the strings share the same wordline WL.

When programming data into multi-level cells (MLCs), a Q-number of pages of data may be programmed into single page of QX MLC storage (e.g., a page of FGTs to be programmed as QX MLCs). So, for example, three data pages of data may be programmed into a single storage page of 3×MLCs. A programming operation to program a Q-number of pages of data into a QX MLC storage page may include a plurality of programming stages or phases, including a first or initial phase (which may be referred to as the LM phase), a second or intermediate phase (which may be referred to as the foggy phase), and a third or final phase (which may be referred to as the fine phase). A series or sequence of programming voltage pulses may be applied in each of the phases. The different phases may be different from each other in that their respective pulses may have different magnitudes or voltage levels, their respective magnitude step sizes in between pulses may be different, the number of pulses in their respective series or sequence may be different, verify voltage levels may be different, or a combination thereof.

The programming operation may be separated into a plurality of stages in order to reduce or minimize the program disturb effects associated with adjacent storage pages and/or wordlines. To do so, subsequent phases performed on an nth wordline $WL_n$ to store a Q-number of data pages in an nth storage page of QX MLCs coupled to the nth wordline $WL_n$ may depend on performance of earlier phases on neighboring wordlines $WL_{n+1}$ and $WL_{n+2}$, where the (n+1)th wordline $WL_{n+1}$ is in the middle of and adjacent to each of the nth wordline $WL_n$ and the (n+2)th wordline $WL_{n+2}$.

In further detail, as an example illustration of a multi-phase programming operation, suppose three data sets, including an nth data set $D_n$, an (n+1)th data set $D_{n+1}$, and an (n+2)th data set $D_{n+2}$, are to be programmed into three adjacent or consecutive MLC storage pages, including an nth storage page $P_n$ that is coupled to an nth wordline $WL_n$, an (n+1)th storage page $P_{n+1}$ that is coupled to an (n+1)th wordline $WL_{n+1}$, and a (n+2)th storage page $P_{n+2}$ that is coupled to an (n+2)th wordline $WL_{n+2}$. To program the data sets $D_n$, $D_{n+1}$, $D_{n+2}$ into the three storage pages $P_n$, $P_{n+1}$, $P_{n+2}$, first, a first phase of a first program operation associated with the nth data set $D_n$ is performed by applying a first series of pulses associated with the first phase to the nth wordline $WL_n$. Then, before performing a second phase of the first program operation, a first phase of a second program operation associated with the (n+1)th data set $D_{n+1}$ is performed by applying a first series of pulses associated with the first phase to the (n+1)th wordline $WL_{n+1}$. Subsequently, the second phase of the first program operation is performed by applying a second series of pulses associated with the second phase to the nth wordline $WL_n$. Then, before performing a third phase of the first program operation or a second phase of the second program operation, a first phase of a third program operation associated with the (n+2)th data set $D_{n+2}$ is performed by applying a first series of pulses associated with the first phase to the (n+2)th wordline $WL_{n+2}$. Subsequently, the second phase of the second program operation is performed by applying a second series of pulses associated with the second phase to the (n+1)th wordline $WL_{n+1}$, and the third phase of the first program operation is performed by applying a third series of pulses associated with the third phase to the nth wordline $WL_n$. Then, since all three phases have been performed on the nth wordline $WL_n$, the nth data set $D_n$ the first program operation may be complete and the nth data set $D_n$ may be considered programmed into the nth storage page $P_n$. The second and third program operations may be similarly completed upon beginning the programming of additional data sets $D_{n+3}$ and $D_{n+4}$ into (n+3)th and (n+4)th storage pages $P_{n+3}$ and $P_{n+4}$.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that provides status information to the controller 102 as well as provide chip-level control of memory operations. The peripheral circuitry 150 may also include volatile memory 154. An example configuration of the volatile memory 154 may include latches, although other configurations are possible.

In addition, the peripheral circuitry 150 may include power control circuitry 156 that is configured to generate and supply voltages to the memory array 142, including voltages (including program voltage pulses) to the wordlines, erase voltages (including erase voltage pulses), the source select gate bias voltage $V_{SSG}$ to the source select gate bias line SSG, the drain select gate bias voltage $V_{DSG}$ to the drain select gate bias line DSG, as well as other voltages that may be supplied to the memory array 142. In one example configuration, the power control circuitry may include charge pumps to generate the voltages, although other configurations may be possible.

Figure 4:
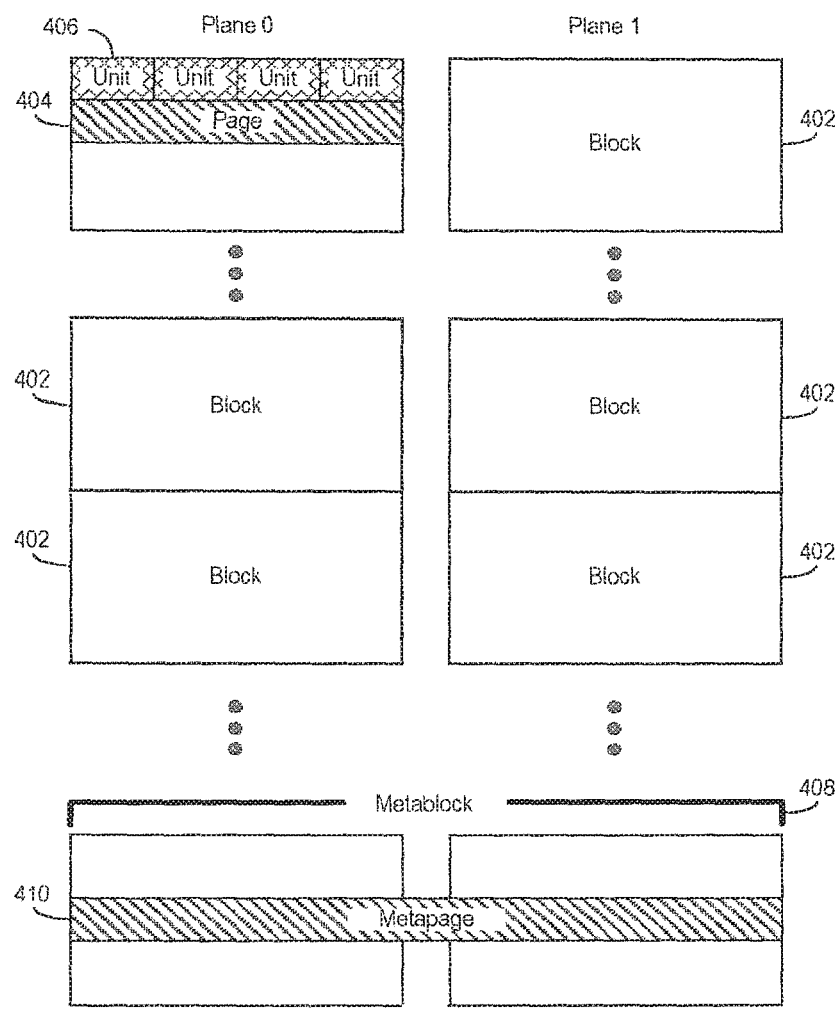
FIG. 4 is a block diagram of an example organizational arrangement or hierarchy of a memory array for flash memory.

Referring to FIG. 4, the memory array 142 and/or a plurality of memory arrays 142 spanning multiple memory dies 104 may have an organizational arrangement or hierarchy under which memory elements or cells of the memory array 142 and/or multiple memory arrays 142 of multiple memory dies 104 may be organized. The controller 102 may be configured to store and access data in accordance with the organizational arrangement or hierarchy.

FIG. 4 is a block diagram of an example organizational arrangement or hierarchy of a memory array 142 for flash memory. As mentioned, for flash memory, the memory cells may be divided or organized into blocks 402, and each block 402 may further be divided into a number of pages 404. Each block 402 may contain the minimum number of memory elements that may be erased together. In addition, each page 404 may be a unit of sensing in the memory array 142. Each individual page 404 may further be divided into segments or units 406, with each segment or unit 406 containing the fewest number of memory cells that may be written to at one time as a basic programming operation. Data stored in a segment or unit of memory cells—referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. The pages 404 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 402 may be configured. Generally, a plane includes a "column" of blocks 402, although other configurations may be possible. A single memory array 142 may include a single plane or multiple planes. The example arrangement shown in FIG. 4 includes two planes, Plane 0 and Plane 1. Data stored in different planes may be sensed simultaneously or independently.

Additionally, the organizational arrangement or hierarchy may include metablocks 408 and metapages 410. A metablock address or number identifying a metablock may be mapped to and/or correspond to a logical address (e.g., a logical group number) provided by a host. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes located of multiple memory dies 104.

Referring back to FIG. 2A, a host and the non-volatile memory system 100 may use different addressing schemes for managing the storage of data. For example, when a host wants to write data to the non-volatile memory system 100, the host may assign a host or logical address (also referred to as a logical block address (LBA)) to the data. Similarly, when the host wants to read data from the non-volatile memory system 100, the host may identify the data it wants read by the logical address. The host may utilize a host or logical addressing scheme in which a host file system maintains a logical address range for all LBAs assigned or recognized by the host. The logical addresses (LBAs) may be grouped into logical groups (LGs), which may further be divided or organized into units of logical sectors. For some examples, host read and write requests may be requests to read and write a segment comprising a string of logical sectors of data with contiguous addresses.

In contrast to the host's logical addressing scheme, the non-volatile memory system 100, as previously described, may store and access data according to one or more physical addressing schemes that use physical addresses different from the logical addresses assigned by the host to store and access data. To coordinate the host's logical addressing with the non-volatile memory system's physical addressing, the media management layer 138 may map logical addresses to physical addresses for storage or retrieval of data.

In some example configurations, the non-volatile memory system 100 may maintain two physical addressing schemes, an actual physical addressing scheme and an abstract physical addressing scheme. For some of these example configurations, direct mappings between the host logical addresses and the abstract physical addresses (rather than the actual physical addresses) may be maintained, and the abstract-to-actual physical translation module 160 may be used to convert the abstract physical addresses to the actual physical addresses. In this way, logical groups and logical sectors of a logical group may be mapped or correspond to metablocks and physical sectors of a metablock.

Figures 5, 6:
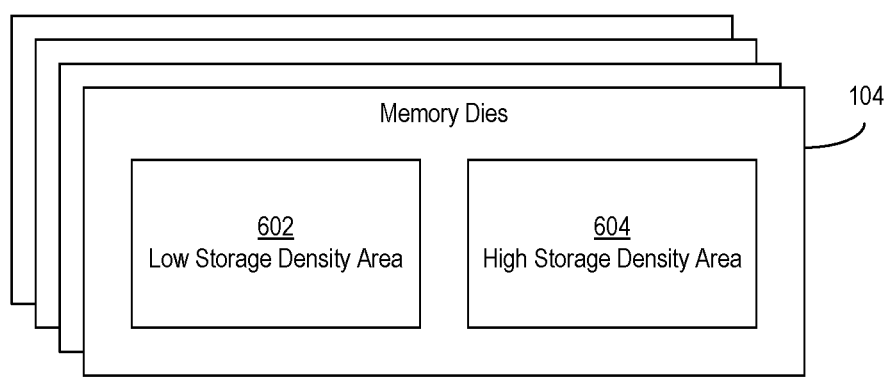
FIG. 5 is a schematic diagram of an example mapping between logical groups and metablocks.
FIG. 6 a block diagram of an example organizational arrangement of memory dies of the non-volatile memory system of FIGS. 1A-2B, where the memory dies are separated or organized into a low storage density area and a high storage density area.

FIG. 5 shows a schematic diagram of an example mapping between an i-th logical groups ($LG_i$) and a j-th metablock ($MB_j$). A logical group may have an M-number of logical group sectors, and a metablock may have an N-number of physical sectors. In some example configurations, M and N may be the same such that there is a one-to-one correspondence between the logical sectors and the physical sectors, and one metablock of storage may store one logical group of data. In other example configurations, N may be greater than M such that multiple logical groups may correspond to a single metablock and one metablock of storage may store two or more logical groups of data.

Additionally, in some instances, the logical sectors of data may be stored in the physical sectors of storage in contiguous and sequential logical order, while in other instances, N logical sectors of data may be stored randomly or discontiguously in the physical sectors of a metablock. In addition, in some instances where data is stored contiguously, there may be an offset between the lowest address of a logical group and the lowest address of the metablock to which it is mapped. In that case, logical sector addresses may wrap around as a loop from the bottom back to the top of the logical group within the metablock. For example, as shown in the bottom diagram of FIG. 5, and assuming M and N are the same, a metablock $MB_J$ may store data associated with a logical sector m in its first physical sector 0. When the last logical sector M−1 is reached, the logical sectors may wrap around such that the first logical sector 0 is stored contiguously and sequentially after logical sector 0, and the logical sector m−1 is stored in the last physical sector N−1. A page tag may be used to identify any offset, such as by identifying the starting logical sector address of the data stored in the first physical sector of the metablock.

In other example configurations, the non-volatile memory system 100 may maintain only a single physical addressing scheme and/or directly map the host logical address to the actual physical addresses rather than the abstract physical addresses. Hereafter, for purposes of the present description, and unless expressly described otherwise, no distinction is made between abstract physical addresses and actual physical addresses, and they are collectively referred to herein as physical addresses.

In order to keep track of where in the non-volatile memory system 100 data is stored, the non-volatile memory system 100 may maintain and manage a directory system or address mapping database that maps relationships or associations between logical addresses and physical addresses. The address mapping database may include one or more address data structures (such as tables, listings, logs, or databases as examples) that track and identify the logical-physical address relationships or mappings.

The address mapping database may be configured in various ways to track or identify where data is stored. For example, the address mapping database may include a primary address data structure (also referred to as a Group Address Table (GAT)) that provides a primary logical-physical address mapping for logical addresses included in the logical address range recognized by the host system 101. Various configurations of the mapping for the GAT are possible. In one example configuration for flash technology, the GAT keeps track of logical-physical address mapping between logical groups of logical sectors and corresponding metablocks. The GAT includes an entry for each logical group, ordered sequentially according to logical addresses. In addition, the GAT may be organized into a plurality of GAT pages, with each GAT page including entries identifying a metablock address for every logical group. For some example configurations, the address data structures may include at least one secondary address data structure in addition to the GAT. The at least one secondary address data structure may provide logical-physical address mapping for data fragments, may track changes or updates to where data is stored, or some combination thereof. One example secondary address data structure, referred to as GAT Delta, may track changes to entries and/or include a listing of changed entries in the mappings of the GAT. When data is re-written, the new version of the data may be written to another part of the non-volatile memory system 100, such as in an update block. GAT Delta may map data stored in the update blocks with associated logical groups. Other secondary address data structures may be possible.

In addition to the organizational arrangement or hierarchy as described with reference to FIG. 4, different portions or areas of the memory dies 104 may be separated or partitioned into different storage density areas. FIG. 6 is a block diagram of an example organizational arrangement, where the memory dies 104 are separated or organized into a low storage density area 602 and a high storage density area 604. Memory cells of the low storage density area 602 are configured or programmed to store a lower number of bits of data per cell than the memory cells of the high density storage area 604. In some example embodiments, the memory cells of the low storage density area 602 may be single-level cells (SLCs) that are programmed to store one-bit of data per cell, and the memory cells of the high storage density area 604 may be multi-level cells (MLCs) that are programmed to store multiple bits of data per cell. However, in other example embodiments, both the low storage density area 602 and the high storage density area 604 may include MLCs, with the MLCs of the high storage density area 604 being programmed to storage a larger number of bits of data per cell than the MLCs of the low storage density area 602. Also, although the example embodiment shown in FIG. 5 includes two different density storage area 602, 604, in other example embodiments, different portions or areas of the memory dies 104 may be separated into more than two different storage density area, such as a first memory area designated for storage of one-bit of data per cell, a second memory area designated for storage of two-bits of data per cell, and a third memory area designated for storage of three-bits per cell, as an example.

Various ways to separate different areas of the memory dies 104 into different density storage areas may be possible.

For some example configurations, data that is received from a host system, the controller 102 may be configured to initially store the data into the low storage density area 602 of the memory dies 104 instead of the high storage density area 604. At a later time, the controller 102 may then determine to store the data in the high storage density area 604. The moving of the data from the low storage density area 602 to the high storage density area 604 may be referred to as a folding operation.

One reason the controller 102 may store data in the low storage density area 602 before storing the data in the high storage density area 604 is because the amount of storage space of the RAM 116 is limited. That is, the RAM 116 may not have enough space to hold the data before it is programmed into the high storage density area 604, and so the controller 102 essentially uses the low storage density area 602 as a temporary cache. Another reason is that the storage of data in higher density storage is more prone to errors than lower density storage (e.g., the programming of data into MLCs is more prone to errors than the programming of data into SLCs). As described in further detail below, after the data is programmed into the high density storage area 604, the controller 102 may perform a verification operation, referred to as an enhanced post write read (EPWR) operation, to verify that the data has been programmed into the high density storage area 604 correctly. Before the EPWR operation is complete, it may be desirable to have a backup copy of the data in the low density storage area 602 in case the EPWR operation indicates that the data has not been stored in the high density storage area 604 correctly, and a subsequent program operation to program the data into the high density storage area 604 is to be performed.

In some example configurations, when data received from a host system is initially programmed into the low storage density area 602, the controller 102 may update the address mapping database to identify where the data is being stored in the low storage density area 602. Subsequently, when the controller 102 performs a folding operation to move the data to the high storage density area 604, the controller 102 may update the address mapping database to identify where the data is being stored in the high storage density area 604. Consequently, for these example configurations, the controller 102 performs two update operations of the address mapping database, a first update for storage of the data in the low storage density area 602 and a second update for storage of the data in the high storage density area 604. Since the address mapping database may be stored in the memory dies 104, then updating the address mapping database generally includes writing information to the memory dies 104.

In configurations where two updates to the address mapping database are performed, the controller 102 may be configured to keep the data in the low storage density storage area 602 for an extended period of time before it is folded. It is not until the low storage density area 602, which may span several blocks and/or several dies, reaches a threshold level near maximum capacity that the controller 102 may determine to move the data into the high storage density area 604 to free up space in the low storage density area 602. In general, the low storage density area 602 may provide better endurance characteristics compared to the high storage density area 604. As such, it may be desirable for the memory system 100 to keep data stored in the low density storage area 602 for as long as possible. However, if data is to be stored in the low storage density area 602 for an extended period of time before it is folded into the high storage density area 604, then it may be desirable for the controller 102 to update the address mapping database to identify the version of the data stored in the low storage density area 602 due to the likelihood of receiving host commands to read or program over that data during the extended period of time.

In contrast to those configurations where the controller 102 performs two updates to the address mapping database for data that is folded, the controller 102 of the present description may be configured to perform folding operations and track the status of the data being stored and/or programmed in the low and high storage density areas 602, 604 such that the controller 102 does not update the address mapping database to identify the version of the data being stored in the low storage density area 602, which in turn reduces the amount of updating to the address mapping database that the controller 102 performs. The controller 102 may be able to avoid updating the address mapping database to map the version stored in the low storage density area 602 by performing relatively immediate folding of the data into the high storage density area 604 once the data is programmed into the low storage density area 602, in combination with using a pointer system that tracks the programming status of the data being folded into the high storage density area 604. Such a folding process may differ from other folding processes that do not perform immediate folding.

Figure 7:
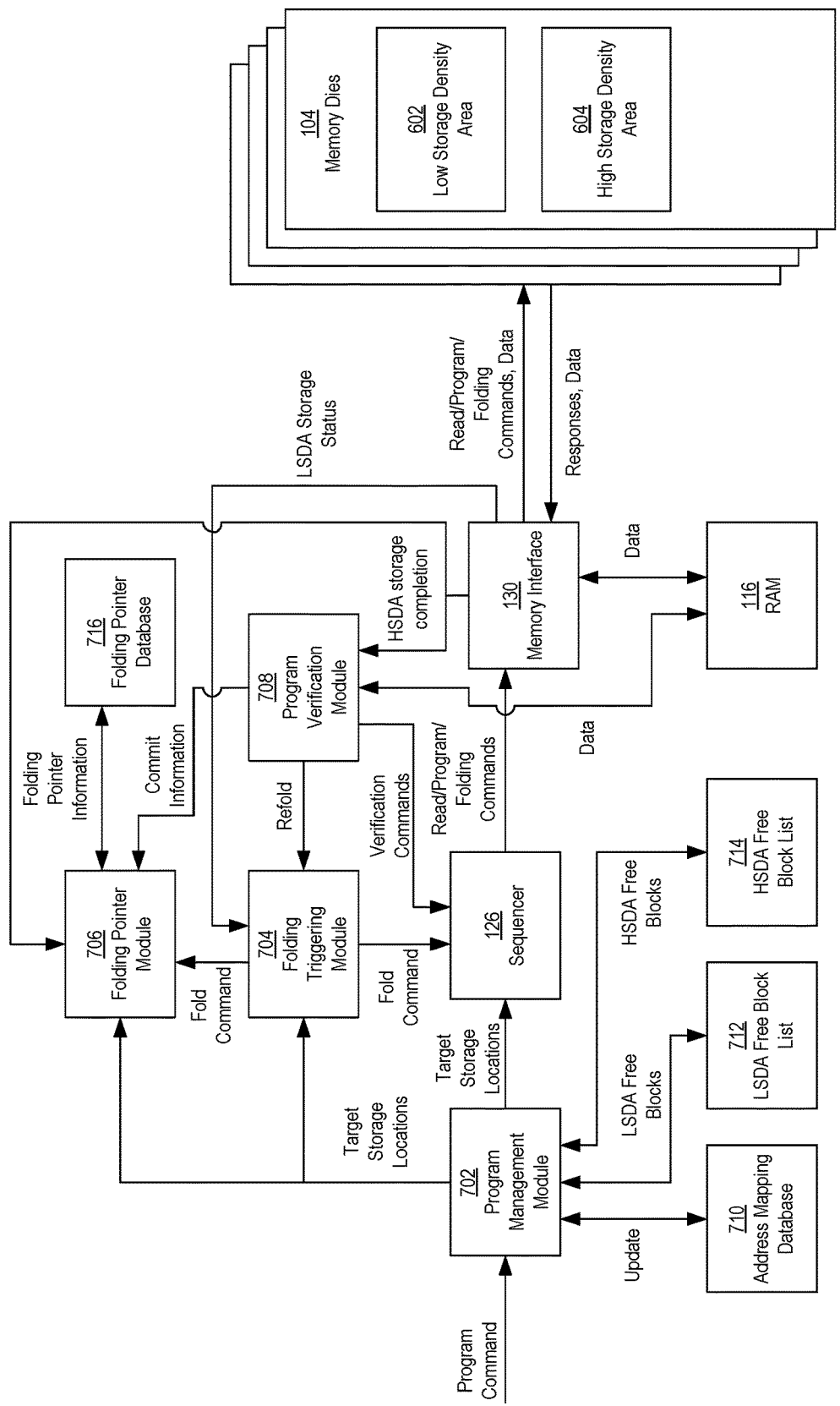
FIG. 7 is a block diagram of components of the non-volatile memory system of FIGS. 1A-2B that may be involved in performance of folding operations.

FIG. 7 is a block diagram that shows components of the memory system 100 that may be involved in folding operations to fold data sets from the low storage density area 602 to the high storage density area 604. The components may include a folding management system, which may include a program management module 702, a folding triggering module 704, a folding pointer module 706, and a folding verification module 708. For some example configurations, the modules of the folding management system may be components of the media management layer 138 of the controller 102 (FIG. 2A), although for other example configurations, one or more of the modules may be considered separate from the media management layer 138. For example, the modules may be separate from the media management layer 138 but still components of the controller 102, the modules may be configured on the dies 104, or a combination thereof. In this context, a controller that includes the modules of the folding system or is configured to perform the modules of the folding system may be the controller 102, a controller or control circuit configured on the dies 104, or a controller that includes components that are part of both the controller 102 and the dies 104. Various ways of implementing the modules of the folding system into the memory system 100 are possible.

Also, FIG. 7 shows the modules 702-708 being coupled and/or in communication with the RAM 116, the sequencer module 126, and the memory interface 130. (Of course, for configurations where a module of the folding system is configured on a die 104, that module may not have to communicate with the die 104 via the memory interface 130 in order to have the die perform a desired action). In addition, the program management module 702 may be configured to access the address mapping database (labeled 710 in FIG. 7) to update logical-physical mappings, a low storage density area (LSDA) list 712 to obtain information about and select available blocks in the low storage density area 602 in which to program data, and a high storage density area (HSDA) list 714 to obtain information about and select available blocks in the high storage density area 604 in which to fold the data stored in the low storage density area 602. Also, as shown in FIG. 7, the folding pointer module 706 may be in communication with and configured to manage a folding pointer database to manage its pointer system.

When a host system sends a host program (or write) command to the memory system 100 to request or instruct that the memory system 100 program (or write) a data set into the memory dies 104, the front end module 108 (FIG. 2A), may receive the program command and provide the program command to the program management module 702. The host system may also provide the data that the host wants written to the memory system 100, which may be loaded into the RAM 116. The program command may identify the host logical address information associated with the data set, as well as other information, such as the size of the data set. In response to receipt of the program command, the program management module 702 may access the LSDA free block list 712 to identify one or more available LSDA blocks in the low storage density area 602 that are available to store the data set. The LSDA block(s) that are selected may be considered a LSDA target storage location of the low storage density area 602 in which the data set is to be initially stored. The LSDA target storage location and/or information associated with the LSDA target storage location may include address information that identifies the available LSDA block(s) that were selected and/or particular storage pages within the selected available LSDA block(s). In addition, the program management module 702 may access the HSDA free block list 714 to identify one or more available HSDA blocks in the high storage density area 604 that are available to store the data set. The HSDA block(s) that are selected may be considered a HSDA target storage location of the high storage density area 604 in which the data set is to be stored as a result of a folding operation.

Upon selecting the LSDA and HSDA target storage locations, the program management module 702 may provide the target storage locations to the sequencer 126, the folding triggering module 704, and the folding pointer module 706. The sequencer module 126, upon receipt of the LSDA target storage location, may be configured to generate one or more program context commands to have the data set stored in the LSDA target storage location of the low storage density storage area 602. In some example configurations, the program context commands may include pairs of data transfer and program commands, where the data transfer command is sent to transfer the data set to the memory dies 104, and the program command is sent to program the data set into the LSDA target location. Other types or formats for the program context commands may be possible. As shown in FIG. 7, the sequencer module 126 may send the program context commands to the memory dies 104 via the memory interface 130. Also, upon sending the program context commands (or at least the data transfer context command), the data set loaded in the RAM 116 may be transferred from the RAM 116 to the memory dies 104 via the memory interface 130 for storage in the LSDA target storage location. Also, in some example configurations, the state machine 152 located in the memory dies (FIG. 2B) may be configured to send back one or more replies or status messages to indicate that the data set is programmed in the LSDA target storage location.

The folding triggering module 704 may be configured to trigger the folding of the data set to the HSDA target storage location. In this context, for a folding operation, the LSDA target storage location may be referred to as a source storage location and the HSDA target storage location may be referred to as a destination storage location of the data set.

When the folding triggering module 704 determines to have the data folded to the HSDA target storage location, the folding triggering module 704 may be configured to provide a folding command to the sequencer module 126. In response, the sequencer module 126 may be configured to generate one or more folding context commands to have the data set copied to the HSDA target storage location. In some situations, the folding operation may include an off-chip copy or copy-through-controller (CTC) operation, where the data set is retrieved from LSDA target storage location, loaded into the RAM 116 via the memory interface 130, and then copied to the HSDA target storage location via the memory interface 130. In other situations, the folding operation may include an on-chip copy (OCC) operation, where the data set is copying from the LSDA target storage location to the HSDA target storage location is performed solely within the memory dies 104. Also, FIG. 7 shows the folding triggering module 704 as being a component of the controller 102. However, in other example configurations, the folding triggering module 704 (or an additional folding triggering module) may be a component of the memory dies 104 (i.e., located on-chip as part of the peripheral circuitry of the memory dies).

The folding triggering module 704 may be configured to start the folding operation in response to determining that a capacity of the LSDA target storage location has reached a threshold level. Prior to the LSDA target storage location storing a threshold amount of data of the data set, the folding triggering module 704 may determine to not yet perform the folding operation. Then, upon a threshold amount of data of the data set being stored in the LSDA target storage location, the folding triggering module 704 may determine to start the folding operation. In some example configurations, the threshold level may correspond to the earliest that the folding operation can be performed. Additionally, for a particular example configuration, the threshold level may be a maximum capacity of the LSDA target storage location. That is, all of the data of the data set being stored in the LSDA target storage location may trigger the folding triggering module 704 to start the folding operation.

The folding triggering module 704 may determine when the threshold has been reached in various ways. For example, the folding triggering module 704 may be configured to receive LSDA storage status information via the memory interface 130, as shown in FIG. 7. The LSDA storage status information may indicate data sets (or portions of data sets) that are stored in the LSDA target storage locations. The LSDA storage status information may be based on the program context commands sent to the memory dies and/or responses received from the memory dies 104 acknowledging that the data is stored. Alternatively, the folding triggering module 704 may be configured to communicate with the sequencer module 126 in order to determine whether the threshold has been reached. Various ways to monitor whether an LSDA target storage location has reached a threshold level are possible.

The LSDA target storage location and the HSDA target storage location may have the same storage capacity. For some example configurations, the LSDA target storage location and the HSDA target storage location may be defined on a storage page level. As a particular example, the HSDA target storage location may be a single QX MLC storage page that can storage a plurality of pages of data. The pages of the LSDA storage area may have the same total storage capacity as the single QX MLC storage page, but the memory cells making up the storage pages may be programmed to have a lower storage density per cell. A non-limiting example may be where the single MLC storage page is a 3×MLC storage page, meaning that each memory cell of the single 3X MLC storage page is programmed to store three bits of data. If, for example, the cells of the low storage density area 602 are programmed as SLCs, then the LSDA target storage location for the data set includes three storage pages of SLCs.

The memory dies 104 may be configured to program data sets into the high storage density area 604 according to multi-phase programming, as previously described. Accordingly, when the memory dies 104 receive a folding command to fold the data set into the HSDA target storage location, the memory dies 104 may perform an initial or first phase of the program operation to program the data set into the HSDA target storage location. Performing the first phase may involve the power control circuitry 156 (FIG. 2B) sending a series of pulses to the wordline that is coupled to the QX MLC storage page that is the HSDA target storage location. However, the memory dies 104 may not perform the next programming phase on the HSDA storage location until a first phase of a next programming operation to fold another data set into an adjacent HSDA storage location is performed, in accordance with multi-phase programming.

Example folding operations performed with the components shown in FIG. 7 are illustrated with respect to FIGS. 8A-8E, which show LSDA and HSDA tables 802, 804 that indicate the status of a plurality of folding operations to fold a plurality of data sets into a plurality of adjacent QX MLC storage pages. At least some of the information included in the LSDA and HSDA tables 802,804 may represent information included in and/or that can be identified from information included in the folding pointer database 716.

In further detail, each of FIGS. 8A-8E show an LSDA table 802 that identifies low storage density area program status information, and a HSDA table 804 that identifies high storage density area program status information. The LSDA table 802 includes two columns, a first column identifying adjacent LSDA wordlines WL coupled to LSDA storage pages, and a second column indicating whether a storage page coupled to an associated LSDA wordline WL is storing data. Additionally, a bolded box 806 is shown in the LSDA table 802 to identify a current LSDA target storage location that the folding triggering module 704 may be monitoring. The HSDA table 804 includes four columns, including a first column identifying adjacent HSDA wordlines coupled to HSDA storage pages, and three columns indicating whether respective phases of a multi-phase programming operation are complete for an associated HSDA wordline. To illustrate the example folding operations with respect to FIGS. 8A-8E, the LSDA wordlines in the LSDA table 802 include twelve wordlines $WL_m$ to $WL_{m+11}$, and the HSDA wordlines in the HSDA table 804 include four wordlines $WL_n$ to $WL_{n+3}$.

The example folding operations described with respect to FIGS. 8A-8E are for an example implementation where the low storage density area 602 includes SLC, and the high storage density area 604 includes 3×MLCs. Accordingly, the solid box 806 shown in FIGS. 8A-8E defines the current LSDA target storage location as including three storage pages of SLCs corresponding to a single 3X MLC storage page.

The data stored in the low storage density area 602 may be folded into the high density storage area 604 in an order corresponding to sequential addresses of both the low storage density area 602 and the high density storage area 604. In an example configuration, the addresses may be in sequential descending order. So, among data that has not yet been folded, the unfolded data set stored at the lowest address will be the next data set to be folded. In addition, of the HSDA target storage locations that are not yet storing folded data, the HSDA target storage location with the lowest address will be the next HSDA target storage location to receive and store folded data.

To illustrate with respect to FIGS. 8A-8E, before any folding operations are performed, the unfolded data set stored at the lowest address of the low storage density area 602 is a first data set stored in pages coupled to LSDA wordlines $WL_m$ to $WL_{m+2}$, and the available HSDA target storage location with the lowest address among the available HSDA target storage locations is a first HSDA target storage location including a first 3×MLC storage page coupled to a first HSDA wordline $WL_n$. Accordingly, a first folding operation may include the programming of the first data set into the first HSDA target storage location.

Subsequently, the next data set among the remaining unfolded data sets stored at the lowest address of the low storage density area 602 is a second data set stored in pages coupled to LSDA wordlines $WL_{m+3}$ to $WL_{m+5}$, and the next available HSDA target storage location with the lowest address among the remaining available HSDA target storage locations is a second HSDA target storage location including a second 3X MLC storage page coupled to a second HSDA wordline $WL_{n+1}$. Accordingly, a second folding operation following the first folding operation may include the programming of the second data set into the second HSDA target storage location.

Subsequently, the next data set among the remaining unfolded data sets stored at the lowest address of the low storage density area 602 is a third data set stored in pages coupled to LSDA wordlines $WL_{m+6}$ to $WL_{m+8}$, and the next available HSDA target storage location with the lowest address among the remaining available HSDA target storage locations is a third HSDA target storage location including a third 3X MLC storage page coupled to a third HSDA wordline $WL_{n+2}$. Accordingly, a third folding operation following the first and second folding operations may include the programming of the third data set into the third HSDA target storage location.

Subsequently, the next data set among the remaining unfolded data sets stored at the lowest address of the low storage density area 602 is a fourth data set stored in pages coupled to LSDA wordlines $WL_{m+9}$ to $WL_{m+11}$, and the next available HSDA target storage location with the lowest address among the remaining available HSDA target storage locations is a fourth HSDA target storage location including a fourth 3×MLC storage page coupled to a fourth HSDA wordline $WL_{n+3}$. Accordingly, a fourth folding operation following the first, second, and third folding operations, may include the programming of the fourth data set into the fourth HSDA target storage location.

In addition, FIGS. 8A-8E show four pointers, including a LSDA write pointer and a folded pointer associated with the LSDA table 802 and a HSDA write pointer and a commit pointer associated with the HSDA table 804. The LSDA write pointer may point to the current LSDA target storage location identified by the bolded box 806. When the threshold has been reached and the folding triggering module 704 determines to start a current folding operation, LSDA write pointer may point to a next LSDA target storage location for performance of a next folding operation. In a particular example configuration, as shown in FIGS. 8A-8E, the LSDA write pointer may point to a first wordline coupled to a first LSDA storage page where initial data of a data set to be stored in the current LSDA target storage location is stored. In addition or alternatively, the LSDA write pointer points to a smallest or lowest memory address of the current LSDA target storage location. Other configurations for implementing the LSDA write pointer to point to the current LSDA target storage location may be possible.

The folded pointer may point to a storage location that defines a boundary separating storage locations for which the folding operation is complete and storage locations for which the folding operation is incomplete. A folding operation may be complete when the memory dies 104 perform all of the phases (e.g., all three phases) of a multi-phase program operation to store a data set in a HSDA target storage location. Conversely, if less than all of the phases are performed, then the folding operation may be considered incomplete. For some example configurations, the memory dies 104 may store data in order of increasing memory address. Accordingly, folding operations for data stored in storage locations having memory addresses greater than the memory address to which the folded pointer points may be considered incomplete, whereas folding operations for data stored in storage locations having memory addresses less than or equal to the memory address to which the folded pointer points may be considered complete. For these example configurations, the folded pointer may point to the last LSDA target storage location for which the last (e.g., third) phase of the programming operation is performed. Other ways to utilize the folded pointer to define a boundary separating complete and incomplete folded operations may be possible.

The HSDA pointer may point to a next HSDA target storage location where a first phase of a programming operation for a next folding operation is to be performed. Upon performance of the first phase, the HSDA pointer may move to a next HSDA target storage location where a first phase of a programming operation for a next folding operation is to be performed.

The commit pointer may point to a storage location that defines a boundary separating storage locations that are committed and storage locations that are uncommitted. Referring back to FIG. 7, after a folding operation to store a data set in a HSDA target storage location is performed (i.e, all of the programming phases are performed for that data set), the program verification module 708 may be configured to verify that the data set is stored correctly. As shown in FIG. 7, the program verification module 708 may receive HSDA storage completion information from the memory dies 104 via the memory interface 130 to indicate that all three phases have been performed, which may trigger the program verification module 708 to perform a verification operation on the data set stored in the HSDA target storage location. In some example configurations, the program verification module 708 may be configured to perform an enhanced post write read (EPWR) operation in order to verify that the data set is written correctly. For the EPWR operation, the data set programmed into the HSDA target storage location may be read from the HSDA target storage location and loaded into the RAM 116. FIG. 7 shows the program verification module 708 being configured to provide verification commands to the sequencer module 126, which in turn may cause the sequencer module 126 to issue one or more read commands to have the data set loaded into the RAM 116. The program verification module 708 may then be configured to perform error checking on the data set loaded into the RAM 116. In the event that the program verification module 708 determines that the error checking has failed, the program verification module 708 may send a refold command to the folding triggering module 704 in order to have the data set refolded from the LSDA target storage location to the HSDA target storage location (or a different HSDA target storage location). Alternatively, if the program verification module 708 determines that the data set passes error checking, then the program verification module 708 may identify the data set as committed, in which case the folding operation does not have to be performed again. After a data set stored in the HSDA target storage location is identified as committed, the corresponding version of the data set stored in the LSDA target storage location may be deleted. However, prior to the verification operation verifying the data set, the corresponding version of the data set may be kept in the LSDA target storage location.

Referring back to FIGS. 8A-8E, as mentioned, the commit pointer may point to a storage location that defines a boundary separating storage locations that are committed and storage locations that are uncommitted. For example configurations the memory dies 104 store data in order of increasing memory address, data stored in storage locations having memory addresses greater than the memory address to which the commit pointer points may be considered uncommitted, whereas data stored in storage locations having memory addresses less than or equal to the memory address to which the commit pointer points may be considered committed. Other ways to utilize the commit pointer to define a boundary separating committed data and uncommitted data may be possible.

The timing of the performance of the commit operation for one data set and a last (e.g., third) phase of a programming operation of another data may provide a relationship between the commit pointer and the folded pointer. In particular, for given first, second, and third data sets stored in first, second, and third HSDA storage locations coupled to consecutively adjacent first, second, and third wordlines, upon the first data set being committed, the last (e.g., third) phase of the programming operation to program the second data set into the second HSDA storage location will have been performed, but the last phase of the programming operation to program the third data set into the third HSDA storage location (or any other subsequent last programming phases) will not yet have been performed. As a result, when the commit operation for the first data set is completed, the commit pointer may point to the first HSDA wordline adjacent to the HSDA wordline coupled to the second HSDA storage location storing the second data set, where at least a portion of the second data set is also being stored in a LSDA storage location coupled to a LSDA wordline to which the folded pointer is pointing. This relationship between the commit pointer and the folded pointer may be used to identify where a given data set is being stored in the LSDA memory area 602 in the event that the given data set is to be read from the LSDA memory area 602 instead of the HSDA memory area 604, which is described in further detail below with reference to FIGS. 8E, 9 and 10.

Referring back to FIG. 7, the pointers may be managed by the folding pointer module 706, which may keep track of the memory addresses to which the pointers point in a folding pointer database 716. As shown in FIG. 7, the folding pointer module 706 may receive LSDA and HSDA target storage location information from the program management module 702 in order to initially set the pointers, fold command information from the folding triggering module 704 to set the LSDA and HSDA write pointers, HSDA storage completion information to set the folded pointer, and commit information from the program verification module 708 to set the commit pointer.

Referring now to FIG. 8A, the solid box 806 identifies LSDA storage pages coupled to the LSDA wordlines $WL_m$, $WL_{m+1}$, and $WL_{m+2}$ as being the current LSDA target storage location. At this point, none of the data of the first data set is stored in the current LSDA target storage location, as indicated by the entries of the second column of the LSDA table 802 within the bolded box 806 being empty. Accordingly, as shown in FIG. 8A, the LSDA write pointer points to LSDA wordline $WL_m$ to indicate the current LSDA target storage location. Also, FIG. 8A shows the entries of the HSDA table 804 being empty, indicating that none of the phases for any programming operations to program data into to the HSDA storage pages coupled to HSDA wordlines $WL_n$ to $WL_{n+2}$ have been performed yet. Accordingly, the HSDA write pointer points to the HSDA wordline $WL_n$ to indicate where a first phase of a programming operation for the first folding operation will be performed. Additionally, the folded pointer is pointing to a memory address above LSDA wordline $WL_m$ to indicate that none of the LSDA storage pages coupled to LSDA wordlines $WL_m$ to $WL_{m+11}$ are storing data for which the a folding operation has been completed. Similarly, the commit pointer is pointing to a memory address to indicate that none of the HSDA storage pages coupled to HSDA wordlines $WL_n$ to $WL_{n+3}$ are storing committed data.

Referring to FIG. 8B, the LSDA table 802 now shows all of the data of the first data set being stored in the current LSDA target storage location, i.e., in the LSDA storage pages coupled to LSDA wordlines $WL_m$ to $WL_{m+2}$, as indicated by the "X" in the entries. For the example folding operations described with respect to FIGS. 8A-8E, the threshold may be the maximum capacity of the LSDA target storage location. Accordingly, the folding triggering module 704 may detect that the threshold level has been reached and determine to begin the first folding operation. Accordingly, the folding triggering module 704 may issue a fold command to the sequencer module 126, which in turn may issue a folding command to the memory dies 104. Upon receipt, the power control circuitry 156 may supply a series of pulses to HSDA wordline $WL_m$ to perform the first phase of the programming operation of the first folding operation in order to program the first data set into the storage page coupled to HSDA wordline $WL_m$. FIG. 8B shows an "X" in entry 808 to indicate that the first phase for programming the first data set into HSDA wordline $WL_n$ has been performed. Also, upon determining that current the LSDA target storage location reached its threshold level, the folding triggering module may send fold command information to the folding pointer module 706 to indicate that the first folding operation has started. In response, the folding pointer module 706 may update the LSDA pointer to point to an address (e.g., an address associated with LSDA wordline $WL_{m+3}$) that identifies the next LSDA target storage location defined by solid box 806, as well as update the HSDA pointer to point to an address (e.g., an address associated with HSDA wordline $WL_{n+1}$) that identifies the next HSDA target storage location.

Referring to FIG. 8C, the LSDA table 802 now shows all of the data of the second data set being stored in the current LSDA target storage location, i.e., in the LSDA storage pages coupled to LSDA wordlines $WL_{m+3}$ to $WL_{m+5}$, as indicated by the "X" in the entries. Accordingly, the folding triggering module 704 may detect that the threshold level has been reached and determine to begin the second folding operation. Accordingly, the folding triggering module 704 may issue a fold command to the sequencer module 126, which in turn may issue a folding command to the memory dies 104. Upon receipt, the power control circuitry 156 may supply a series of pulses to HSDA wordline $WL_{n+1}$ to perform the first phase of the programming operation of the second folding operation in order to program the second data set into the storage page coupled to HSDA wordline $WL_{n+1}$. FIG. 8C shows an "X" in entry 810 to indicate that the first phase for programming the second data set into HSDA wordline $WL_{n+1}$ has been performed. Additionally, in accordance with the multi-phase programming, the power control circuitry 156 may supply a series of pulses to HSDA wordline $WL_n$ to perform the second phase of the programming operation of the first folding operation, which is indicated by an "X" in entry 812. Also, upon determining that the current LSDA target storage location reached its threshold level, the folding triggering module 704 may send fold command information to the folding pointer module 706 to indicate that the second folding operation has started. In response, the folding pointer module 706 may update the LSDA pointer to point to an address (e.g., an address associated with LSDA wordline $WL_{m+6}$) that identifies the next LSDA target storage location defined by bolded box 806, as well as update the HSDA pointer to point to an address that identifies the next HSDA target storage location (e.g., an address associated with HSDA wordline $WL_{n+2}$).

Referring to FIG. 8D, the LSDA table 802 now shows all of the data of the third data set being stored in the current LSDA target storage location, i.e., in the LSDA storage pages coupled to LSDA wordlines $WL_{m+6}$ to $WL_{m+8}$, as indicated by the "X" in the entries. Accordingly, the folding triggering module 704 may detect that the threshold level has been reached and determine to begin the third folding operation. Accordingly, the folding triggering module 704 may issue a fold command to the sequencer module 126, which in turn may issue a folding command to the memory dies 104. Upon receipt, the power control circuitry 156 may supply a series of pulses to HSDA wordline $WL_{n+2}$ to perform the first phase of the programming operation of the third folding operation in order to program the third data set into the storage page coupled to HSDA wordline $WL_{n+2}$. FIG. 8D shows an "X" in entry 814 to indicate that the first phase for programming the third data set into HSDA wordline $WL_{n+2}$ has been performed.

Additionally, in accordance with the multi-phase programming, the power control circuitry 156 may supply a series of pulses to HSDA wordline $WL_{n+1}$ to perform the second phase of the programming operation of the second folding operation, which is indicated by an "X" in entry 816. Further, the power control circuitry 156 may supply a series of pulses to HSDA wordline $WL_n$ to perform the third phase of the programming operation of the first folding operation, which is indicated by an "X" in entry 818.

Also, upon determining that the current LSDA target storage location reached its threshold level, the folding triggering module 704 may send fold command information to the folding pointer module 706 to indicate that the third folding operation has started. In response, the folding pointer module 706 may update the LSDA pointer to point to an address (e.g., an address associated with LSDA wordline $WL_{m+9}$) that identifies the next LSDA target storage location defined by solid box 806, as well as update the HSDA pointer to point to an address (e.g., an address associated with HSDA wordline $WL_{n+3}$) that identifies the next HSDA target storage location. In addition, as shown in FIG. 8D, since all three phases of programming for the first folding operation have been performed, the folding pointer module 706 may update the folding pointer to point to an address to indicate that the first data set has been folded. The folding pointer module 706 may be configured to determine that all three phases have been performed based on the folding command information received from the folding triggering module 704 and/or from HSDA storage completion information received from the memory interface 130, although other ways may be possible. Accordingly, the folding pointer module 706 or other components of the memory system 100 may interpret the location of the folded pointer to determine that the first data set stored in LSDA storage pages coupled to wordlines $WL_m$ to $WL_{m+2}$ has been folded, and the other data sets stored in LSDA storage pages coupled to wordlines $WL_{m+3}$ to $WL_{m+11}$ have not yet been folded. Otherwise put, the location of the folded pointer may indicate that data stored at a memory address associated with LSDA wordline $WL_{m+2}$ or a lower memory address has been folded, and data stored at a memory address higher than the memory address associated with LSDA wordline $W1_{m+2}$ has not yet been folded. Also, at the stage depicted in FIG. 8D, despite all three phases of the programming operation of the first folding operation having been performed, the program verification module 708 may not yet have performed a verification operation for the first set of data. Accordingly, FIG. 8D shows the commit pointer still pointing to a memory location to indicate that no data stored in HSDA storage pages coupled to wordiness $WL_n$ to $WL_{n+3}$ has been committed.

Referring to FIG. 8E, the LSDA table 802 now shows all of the data of the fourth data set being stored in the current LSDA target storage location, i.e., in the LSDA storage pages coupled to LSDA wordlines $WL_{m+9}$ to $WL_{m+11}$, as indicated by the "X" in the entries. Accordingly, the folding triggering module 704 may detect that the threshold level has been reached and determine to begin the fourth folding operation. Accordingly, the folding triggering module 704 may issue a fold command to the sequencer module 126, which in turn may issue a folding command to the memory dies 104. Upon receipt, the power control circuitry 156 may supply a series of pulses to HSDA wordline $WL_{n+3}$ to perform the first phase of the programming operation of the fourth folding operation in order to program the fourth data set into the storage page coupled to HSDA wordline $WL_{n+3}$. FIG. 8E shows an "X" in entry 820 to indicate that the first phase for programming the third data set into HSDA wordline $WL_{n+2}$ has been performed.

Additionally, in accordance with the multi-phase programming, the power control circuitry 156 may supply a series of pulses to HSDA wordline $WL_{n+2}$ to perform the second phase of the programming operation of the third folding operation, which is indicated by an "X" in entry 822. Further, the power control circuitry 156 may supply a series of pulses to HSDA wordline $WL_{n+1}$ to perform the third phase of the programming operation of the second folding operation, which is indicated by an "X" in entry 824.

Also, upon determining that the current LSDA target storage location reached its threshold level, the folding triggering module 704 may send fold command information to the folding pointer module 706 to indicate that the fourth folding operation has started. In response, the folding pointer module 706 may update the LSDA pointer to point to an address that identifies the next LSDA target storage location (which in this case is an address beyond one associated with LSDA wordlines $WL_m$ to $WL_{m+11}$), as well as update the HSDA pointer to point to an address that identifies the next HSDA target storage location (which in this case is an address beyond one associated with HSDA wordlines $WL_n$ to $WL_{n+3}$).

In addition, in FIG. 8E, since all three phases of programming for the second folding operation have been performed, the folding pointer module 706 may update the folding pointer to point to an address to indicate that the second data set has been folded. The folding pointer module 706 may be configured to determine that all three phases have been performed based on the folding command information received from the folding triggering module 704 and/or from HSDA storage completion information received from the memory interface 130, although other ways may be possible. Accordingly, the folding pointer module 706 or other components of the memory system 100 may interpret the location of the folded pointer to determine that the first data set stored in LSDA storage pages coupled to wordlines $WL_m$ to $WL_{m+2}$ and the second data set stored in LSDA storage pages coupled to wordlines $WL_{m+3}$ to $WL_{m+5}$ have been folded, while the other data sets stored in LSDA storage pages coupled to wordlines $WL_{m+6}$ to $WL_{m+11}$ have not yet been folded.

Also, at the stage depicted in FIG. 8E, the program verification module 708 has performed a verification operation for the first data set and determined that the first data set has been correctly programmed into its associated HSDA target storage location. Accordingly, the program verification module 708 may send commit information to the folding pointer module 706, which in turn may update the commit pointer to point to an address of a HSDA memory location where the first data set is stored (i.e., HSDA storage page coupled to HSDA wordline $WL_n$), as shown in FIG. 8E. However, by pointing to an address where the first data set is stored and not to an address where the second data set is stored, the commit pointer indicates that despite all three phases of the programming operation of the second folding operation having been performed, the program verification module 708 has not yet verified that second data set is committed.

Further folding operations may be started and completed in this manner in order to complete the third, fourth and further folding operations.

In addition, when storing data in the high storage density area 604 using the example folding operations described with respect to FIGS. 7 and 8A-8E, the program management module 702 may not update the address mapping database 710 for data that is stored into the low storage density area 602. That is, the updates to the address mapping database 710 may be to identify where the data is stored in the high storage density area 604, but not in the low storage density area 602, which in turn reduces the amount of updating to the address mapping database 710. Accordingly, when a program command is received and the program management module 702 selects LSDA storage location information from the LSDA free block list 712 and HSDA storage location information from the HSDA free block list 714, the program management module 702 may be configured to update the address mapping database 710 by including a mapping that maps host logical address information included in the program command with an HSDA memory address included in the HSDA storage location information, but not a mapping that maps the host logical address information with a LSDA memory address included in the LSDA storage location information.

Figure 9:
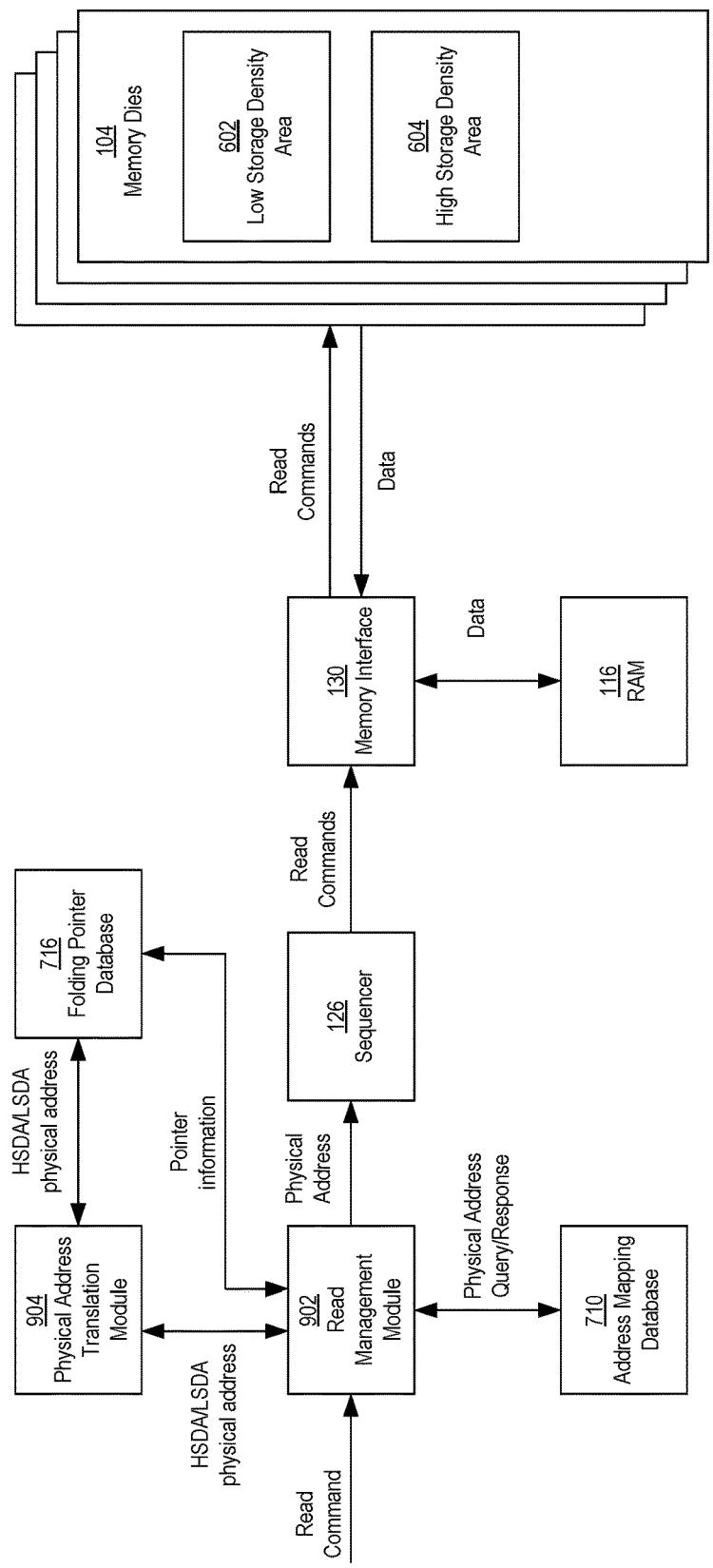
FIG. 9 is a block diagram of components of the memory system involved in read operations.

In further detail, FIG. 9 show a block diagram of components of the memory system 100 that may be involved in executing a read operation, such as in response to receipt of a host read request to read a data set from the memory dies 104. The components shown in FIG. 9 include a read management module 902, the folding pointer database 716, the address mapping database 710, the sequencer module 126, the memory interface 130, the RAM 116, and the memory dies 104. In some example configurations, the read management module 902 may be a component of the memory management layer 138 (FIG. 2A), although in other example configurations, the read management module 902 may be a component outside of the media management layer 138.

When a host read command is received, the read command may be sent to the read management module 902, such as from the front end module 108. The host read command may identify logical address information associated with data that a host system wants read from the memory dies 104. The read management module 902 may be configured to determine a physical address where the data set is stored in the memory dies 104 to the sequencer module 126. In turn, the sequencer module 126 may generate one or more read context commands to retrieve the data and send the one or more read context commands to the memory dies 104 to retrieve the data. In response, the memory dies 104 may sense the data and load the data into the RAM 116. Error detection and correction may then be performed on the data, such as with the ECC engine 124 (FIG. 2A), and assuming that the data passes error correction, the data may be sent back to the host system via the host interface 120 to complete execution of the host read request.

Before providing a physical address information to the sequencer module 126, the read management module 902 may determine whether to retrieve a version of the data set stored in the low storage density area 602 or the high storage density area 604. The read management module 902 may be configured to make the determination based on whether the data set is committed as identified by the commit pointer. Upon receipt of the read command, the read management module 902 may access the folding pointer database 716 (or another database, such as the address mapping database 710, that includes the pointer information). If the commit pointer indicates that the requested data is committed, then the read management module 902 may retrieve data stored at the HSDA physical address associated with the logical address included in the read command. Alternatively, if the commit pointer indicates that the requested data is not committed, then the read management module may determine to retrieve the requested data from the low storage density area 602.

If the read management module 902 determines to retrieve the requested data from the low storage density area 602, then the read management module 902 may utilize, such as by communicating with, a physical address translation module 904 that is configured to perform a physical address translation calculation in order to identify where in the low storage density area 602 the requested data is located.

As previously described, the timing of the performance of the commit operation for one data set and a last (e.g., third) phase of a programming operation of another data may provide a relationship between the commit pointer and the folded pointer. In particular, the commit pointer may point to a HSDA wordline adjacent to another HSDA wordline coupled to a storage location storing a data set, where at least a portion of that data set is also being stored in a LSDA storage location coupled to a LSDA wordline to which the folded pointer is pointing.

This relationship is illustrated in FIGS. 8E and 10. FIG. 10 is similar to FIG. 8E with respect to where the pointers are pointing, except that instead of "X" labels to denote whether or not data is stored and whether or not a certain programming phase is performed, numbered data pages are used to denote particular data pages DP being stored in LSDA and HSDA storage pages coupled to LSDA and HSDA wordlines, respectively. For example, a first data page DP1 is stored in the LSDA storage page coupled to the LSDA wordline $WL_m$, a second data page DP2 is stored in the LSDA storage page coupled to the LSDA wordline $WL_{m+1}$, a third data page DP3 is stored in the LSDA storage page coupled to the LSDA wordline $WL_{m+2}$, a fourth data page DP4 is stored in the LSDA storage page coupled to the LSDA wordline $WL_{m+3}$, a fifth data page DP5 is stored in the LSDA storage page coupled to the LSDA wordline $WL_{m+4}$, a sixth data page DP6 is stored in the LSDA storage page coupled to the LSDA wordline $WL_{m+5}$, and so on. Similarly, the first, second, and third data pages DP1, DP2, DP3 are stored in the HSDA storage page coupled to the HSDA wordline $WL_n$, the fourth, fifth, and sixth data pages DP4, DP5, DP6 are stored in the HSDA storage page coupled to the HSDA wordline $WL_{n+1}$, and so on.

Referring particularly to FIG. 8E, as previously described, when the commit operation commits the first data set stored in the HSDA storage page coupled to the HSDA wordline $WL_n$, the commit pointer points to the HSDA wordline $WL_n$. Immediately before or after the commit operation is performed, the last (third) phase of the programming operation to store the second data set in the next, adjacent HSDA wordline $WL_{n+1}$ is performed, which causes the folded pointer to point to a LSDA wordline coupled to a LSDA storage page storing a portion of the second data set, which in the example shown in FIG. 8E, is the LSDA wordline $WL_{m+5}$ coupled to the LSDA storage page storing the last data page of the second data set. Based on the timing between the commit operation and the last programming operation, the data stored in the LSDA storage page coupled to the LSDA wordline $WL_{m+5}$ is also being stored as the last or upper page in the HSDA storage page coupled to HSDA wordline $WL_{n+1}$. Using this knowledge, the physical address translation module 904 may identify where a given data is being stored in the low storage density by determining how many LSDA wordlines away the given data set is stored in the low storage density area relative to the data to which the folded pointer is pointing.

Two examples are now provided to illustrate the reading of data from either the low storage density area 602 or the high storage density area 604 with reference to FIGS. 9 and 10. In the first example, suppose the read management module 902 receives a read request that identifies a logical address. In response, the read management module 902 may access the address mapping database 710 with the logical address. Suppose in the first example that in response to the access, the read management module 902 identifies that the data being requested to be read is the second data page DP2 stored in the HSDA wordline $WL_n$. The read management module 902 may then determine that the commit pointer is pointing to the HSDA wordline $WL_n$, and in response, determine that the second data page DP2 is committed since it is stored within the boundary of committed data, as indicated by the commit pointer. In response, the read management module 902 may communicate with the sequencer module 126 to have the second data page DP2 read from the HSDA storage page coupled to the HSDA wordline $WL_n$ in the high storage density area 604. Since the read management module 902 identified that the second data page DP2 is committed, the read management module 902 did not utilize the physical address translation module 904 to identify where in the low storage density area 602 the second data page DP2 is being stored.

In a second example, suppose that the read management module 902 accesses the address mapping database 710 and in response, determines that the data requested to be read is the eighth data page DP8 being stored as the middle data page in the HSDA storage page coupled to the wordline $WL_{n+2}$. The read management module 902 may also determine that the commit pointer is pointing to the HSDA wordline $WL_n$, and in response, determine that the eighth data page DP8 is uncommitted since it is being stored outside of the boundary indicated by the commit pointer. As such, the read management module 902 may determine to read the eighth data page DP8 from the low storage density area 602 instead of the high storage density area 604. In response, the read management module 902 may provide the HSDA physical address information to the physical address translation module 904.

In response to receipt of the HSDA physical address information, the physical address translation module 904 may identify that the commit pointer is pointing to the HSDA wordline $WL_n$, and in response know, that the folded pointer is pointing to a LSDA wordline coupled to a LSDA storage page storing data that is also being stored as the last or top data page in a HSDA storage page coupled to $WL_{n+1}$. The physical address translation module 904 may then identify that the eighth data page DP8 stored as the middle data page in the HSDA wordline $WL_{n+2}$ is being stored two LSDA wordlines or storage pages away from where the last data page is being stored in HSDA wordline $WL_{n+1}$. Accordingly, the physical address translation module 904 may determine that the eighth data page DP8 is being stored in a LSDA storage page coupled to a LSDA wordline WL that is correspondingly two LSDA wordlines or storage pages away from the LSDA wordline WL to which the folded pointer is pointing.

Upon accessing the folding pointer database 716, the physical address translation module 904 may identify that the folded pointer is pointing to the LSDA wordline $WL_{m+5}$, and in response, identify that the eighth data page DP8 is being stored in a LSDA storage page coupled to the LSDA wordline $WL_{m+7}$—i.e., the LSDA wordline that is two LSDA wordlines away from LSDA wordline $WL_{m+5}$. The physical address translation module 904 may then provide LSDA physical address information associated with the LSDA wordline $WL_{m+7}$ to the read module 902 (or directly to the sequencer module 126), and the sequencer module 126 may issue context commands to the low storage density area 602 to have the eighth data page DP8 read from the LSDA storage page coupled to the LSDA wordline $WL_{m+7}$ and loaded into the RAM 116.

In sum, as illustrated in the second example, by knowing where the folded pointer is pointing and how many LSDA wordlines or storage pages away the requested data is relative to the data to which the folded pointer is pointing, the physical translation module 904 may translate a HSDA physical address it receives to a LSDA physical address. In turn, the requested data may be read from the low storage density 602 at the LSDA physical address instead of from the high storage density area 604 at the HSDA physical address even though an express or direct mapping between the logical address and the LSDA physical address does not exist in the address mapping database 710. As described, this translation from the HSDA physical address to the LSDA physical address is performed when the data is not verified in the high storage density area 604 and not committed.

Figure 11:
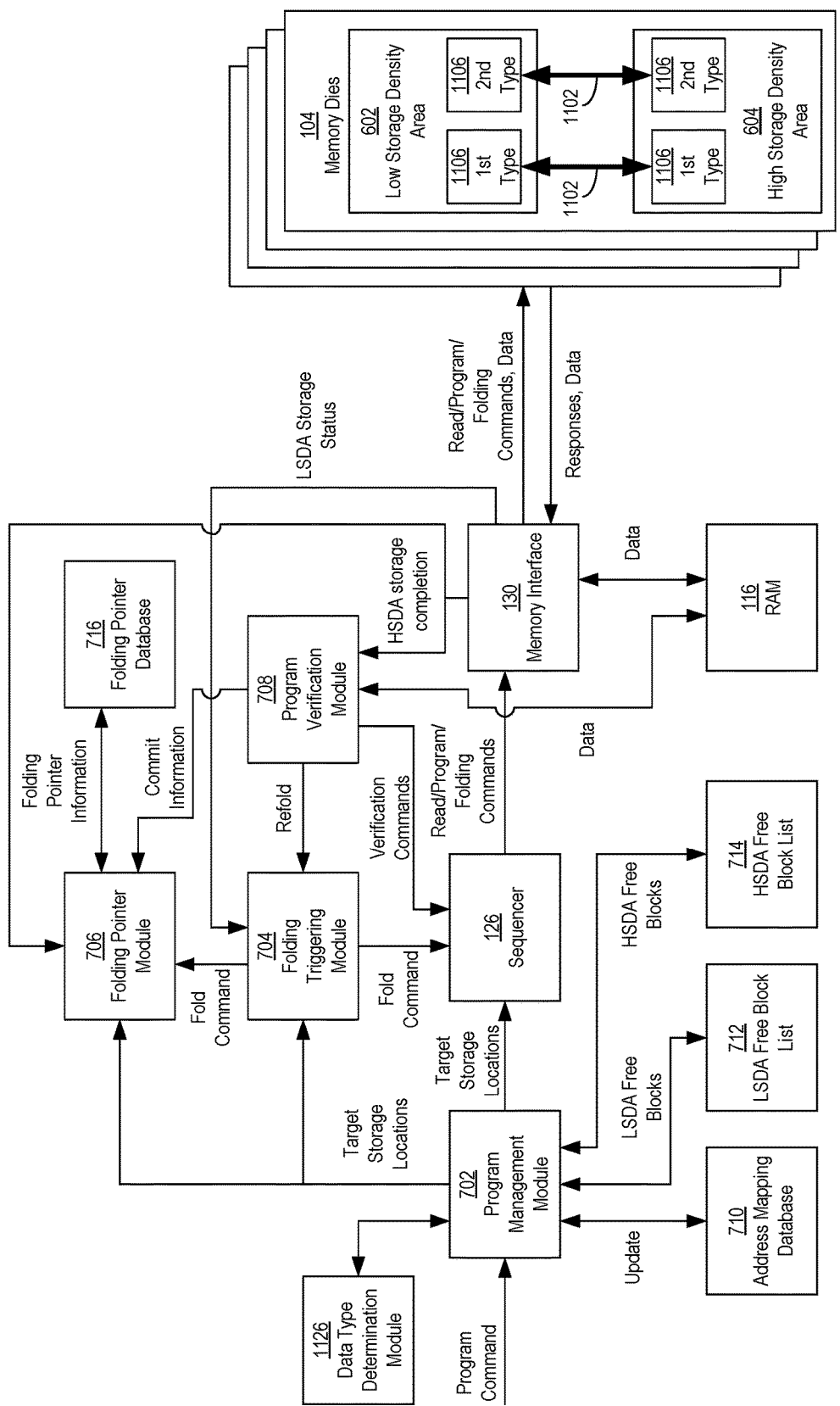
FIG. 11 is a block diagram of another configuration of components of the non-volatile memory system of FIGS. 1A-2B involved in performance of folding operations.

FIG. 11 shows another example configuration of components of the non-volatile memory system 1100 that may be configured to perform a folding operation to fold data from the low storage density area 602 to the high storage density area 604. The components shown in FIG. 11 may be similar to those included for the configuration shown in FIG. 7, except that the components shown in FIG. 11 may further include a data type determination module 1102 that is configured to determine a type for data sets to be programmed in the memory dies 104.

In further detail, each of the low storage density area 602 and the high storage density area 604 may be partitioned or separated into a first type area and a second type area. For example, the low storage density area 602 may be partitioned into a LSDA first type area 1104 and a LSDA second type area 1106. Similarly, the high storage density area 604 may be partitioned into a HSDA first type area 1108 and a second type area 1110. In other example configurations, each of the low storage density area 602 and the high storage density area 604 may be partitioned into more than two different type areas. Areas of the same type may be associated with each other such that data stored in a particular type in the low storage density area 602 may be folded into the same type area of the high storage density area. So, for example, data stored in the LSDA first type area 1104 may be folded into the HSDA first type area 1108 and not the HSDA second type area 1110. Similarly, data stored in the LSDA second type area 1106 may be folded into the HSDA second type area 1110 and not the HSDA first type area 1108.

For these configurations, where data of different types are stored in different areas of the low and high storage density areas 602, 604, data of the same type may be considered to be folded into the high storage density area 604 via a same data stream, and data of different types may be considered to be folded into the high storage density area 604 via different data streams. For example, data of the first type stored in the LSDA first type area 1104 may be folded into the HSDA first type area 1108 via data stream 1112, and data of the second type stored in the LSDA second type area 1106 may be folded into the HSDA second type area 1110 via data stream 1114. For some example configurations, storing and folding data according to different types may decrease write amplification, which in turn, may improve the storing performance of the non-volatile memory system.

For some example configurations, the different data types may include a hot data type and a cold data type. Hot data may be data that is considered to be active data, such as data that is accessed and/or modified within a certain period of time of being stored in the memory dies 104, and/or data that is accessed and/or modified relatively frequently, such as above a predetermined rate threshold. In contrast, cold data may be data that is considered to be inactive data, such as data that is accessed and/or modified later than certain time period from when it is stored in the memory dies 104, and/or data that is accessed and/or modified relatively infrequently, such as below a predetermined rate threshold. For other example configurations, the different data types may include random data and sequential data. Random data and sequential data may be differentiated by their associated sizes, with random data being below a threshold data size and sequential data being above a threshold data size. Additionally, for some example configurations, the size of the data be used to identify the data as hot or cold. For example, random data may be identified as hot data and sequential data may be labeled as cold data. Data types other than hot/cold and random/sequential may be possible.

When the program management module 702 receives a program command to program a data set, the program management module 702 may communicate with the data type determination module 1102 to determine whether the data set as a first type data set or a second type data set. The data type determination module 1102 may utilize one or more criteria, such as a size of the data set, in order to identify the data set as being of the first type or the second type. If the data set is determined to be of the first type, then the program management module 702 may select LSDA and HSDA target locations for the data set from the LSDA and HSDA free block lists 712, 714 so that the data set is stored in the LSDA first type area 1104 and then folded into the HSDA first type area 1108. Alternatively, if the data set is determined to be of the second type, then the program management module 702 may select LSDA and HSDA target locations for the data set from the LSDA and HSDA free block lists 712, 714 so that the data set is stored in the LSDA second type area 1106 and the folded into the HSDA second type area 1110.

Figure 12:
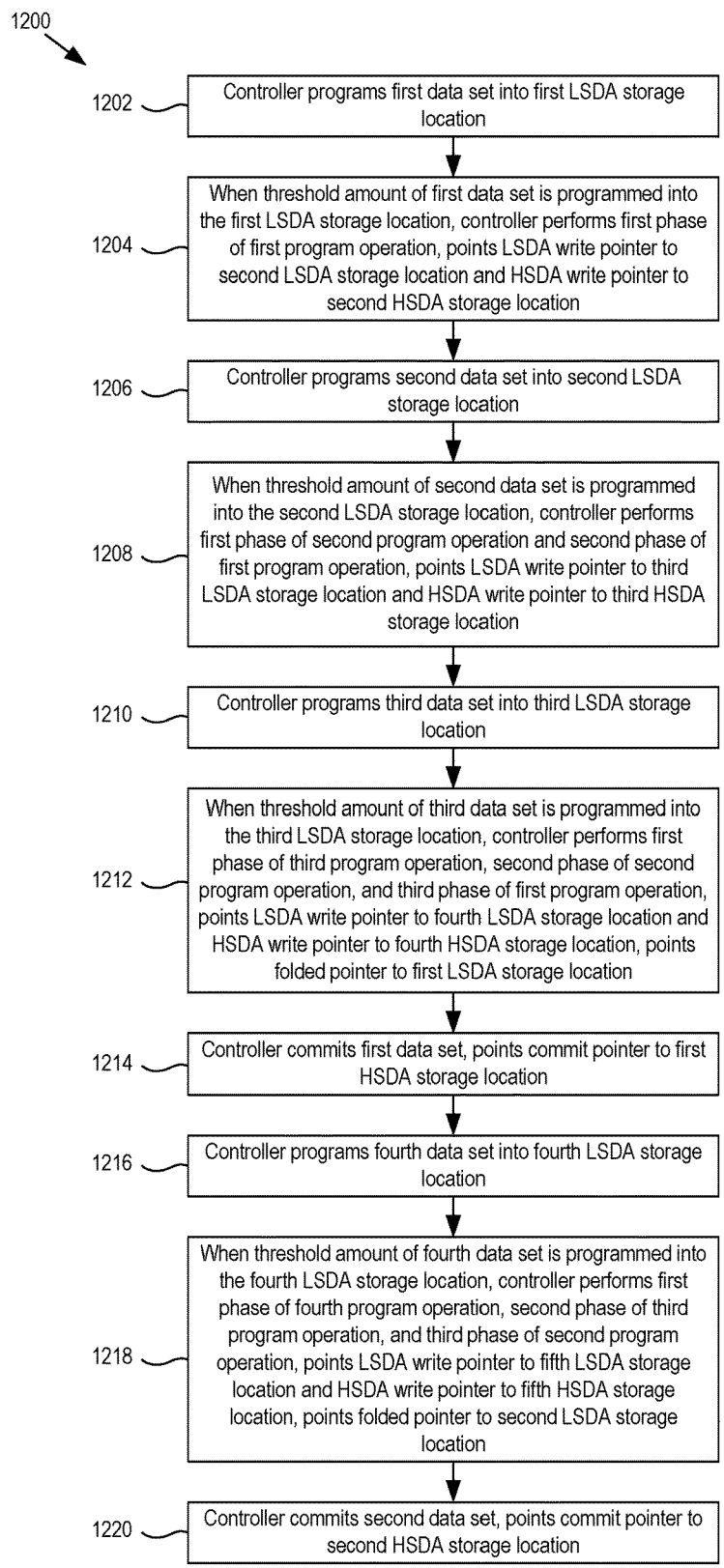
FIG. 12 is a flow chart of an example method of performing a folding operation in a memory system.

FIG. 12 is a flow chart of an example method 1200 of performing a folding operation in a memory system, such as the memory system 100. The folding operation performed with reference to FIG. 12 involves the folding of four data sets stored in four LSDA storage locations of a low storage density memory area (e.g., the low storage density area 602) into four HSDA storage locations of a high storage density memory area (e.g., the high storage density area 604). In some example methods, the LSDA storage locations may be adjacent to each other and the HSDA storage locations may be adjacent to each other. The folding of four data sets is merely illustrative, and other example methods that include similar operations may include the folding of more or fewer than four data sets. Also, the size of each data set corresponds and/or is equal to the storage capacity of associated LSDA and HSDA storage locations. For example, if the low storage density area includes memory cells programmed as SLC cells, and the high storage density area includes memory cells programmed as QX MLC cells, a given HSDA storage location may include a single QX MLC storage page, a given LSDA storage location may include a Q-number of SLC storage pages, and a given data set programmed into each of the given LSDA storage location and the HSDA storage location may include a Q-number of data pages.

At block 1202, a controller of a memory system may program (e.g., through use of a program management module 702) a first data set into a first LSDA storage location of the low storage density area. At block 1204, in response to an amount of the first data set reaching a threshold (e.g., when all of the first data set is programmed into the first LSDA storage location), the controller (e.g., through use of the folding triggering module 704) may begin a first folding operation and control a power control circuit (e.g., the power control circuit 156 of FIG. 2B) to perform a first phase of a first multi-phase programming operation to program the first data set into a first HSDA storage location. Also at block 1204, the controller (e.g., through use of the folding pointer module 706) may update a folding pointer database (e.g., the folding pointer database 716) to have a LSDA write pointer point to a next (second) LSDA storage location and a HSDA write pointer point to a next (second) HSDA storage location.

At block 1206, the controller may program a second data set into the second LSDA storage location of the low storage density area. At block 1208, in response to an amount of the second data set reaching a threshold (e.g., when all of the second data set is programmed into the second LSDA storage location), the controller may begin a second folding operation and control the power control circuit to perform a first phase of a second multi-phase programming operation to program the second data set into the second HSDA storage location. Also at block 1208, the controller may control the power control circuit to perform a second phase of the first programming operation. Additionally, the controller may update the folding pointer database to have the LSDA write pointer point to a next (third) LSDA storage location and a HSDA write pointer point to a next (third) HSDA storage location.

At block 1210, the controller may program a third data set into the third LSDA storage location of the low storage density area. At block 1212, in response to an amount of the third data set reaching a threshold (e.g., when all of the third data set is programmed into the third LSDA storage location), the controller may begin a third folding operation and control the power control circuit to perform a first phase of a third multi-phase programming operation to program the third data set into the third HSDA storage location. Also at block 1212, the controller may control the power control circuit to perform a second phase of the second programming operation and a third phase of the first programming operation. Additionally, the controller may update the folding pointer database to have the LSDA write pointer point to a next (fourth) LSDA storage location and a HSDA write pointer point to a next (fourth) HSDA storage location. Also, assuming that the third phase is the last phase of the multi-phase programming operation, the controller (e.g., through use of the folding pointer module 704) may update the folding pointer database to have a folded pointer point to the first LSDA storage location (e.g., a particular one of the LSDA wordlines or storage pages associated with the first LSDA storage location) to indicate that all of phases of the first multi-phase programming operation have been performed.

At block 1214, in response to all the phases of the first programming operation having been performed, the controller (e.g., through use of the program verification module 708) may perform a commit operation to determine whether the version of the first data set being stored in the first HSDA storage location is committed or verified. Assuming that it is, then the controller (e.g., through use of the folding pointer module 704) may update the folding pointer database to have a commit pointer point to the first HSDA storage location to indicate that the first data set stored in the first HSDA storage location is committed.

At block 1216, the controller may program a fourth data set into the fourth LSDA storage location of the low storage density area. At block 1218, in response to an amount of the fourth data set reaching a threshold (e.g., when all of the fourth data set is programmed into the fourth LSDA storage location), the controller may begin a fourth folding operation and control the power control circuit to perform a first phase of a fourth multi-phase programming operation to program the fourth data set into the fourth HSDA storage location. Also at block 1218, the controller may control the power control circuit to perform a second phase of the third programming operation and a third phase of the second programming operation. Additionally, the controller may update the folding pointer database to have the LSDA write pointer point to a next (fifth) LSDA storage location and a HSDA write pointer point to a next (fifth) HSDA storage location. Also, the controller may update the folding pointer database to have the folded pointer point to the second LSDA storage location (e.g., a particular one of the LSDA wordlines or storage pages associated with the second LSDA storage location) to indicate that all of phases of the second multi-phase programming operation have been performed.

At block 1220, in response to all the phases of the second programming operation having been performed, the controller may perform a commit operation to determine whether the version of the second data set being stored in the second HSDA storage location is committed or verified. Assuming that it is, then the controller may update the folding pointer database to have a commit pointer point to the second HSDA storage location to indicate that the second data set stored in the second HSDA storage location is committed.

Although the example method 1200 is shown as ending at block 1220, other methods may continue with completing the remaining phases and commit operations for the remaining uncommitted data sets in conjunction with programming and folding additional data sets. Also, as shown in FIG. 12, the commit operation to commit the first data set at block 1214 is described as being performed before the fourth data set is programmed into the fourth LSDA storage location at block 1216. For other example methods, the commit operation to commit the first data set may be performed concurrently with or after the fourth data set is programmed into the fourth LSDA storage location. In general, as previously described, the commit operation for the first data set may be performed the third (last) phase of the third data set is performed so that the commit pointer is pointing to where the first data set is being stored in the high storage density area while the folded pointer is pointing to where at least a portion of the second data set being stored in the low storage density area.

Figure 13:
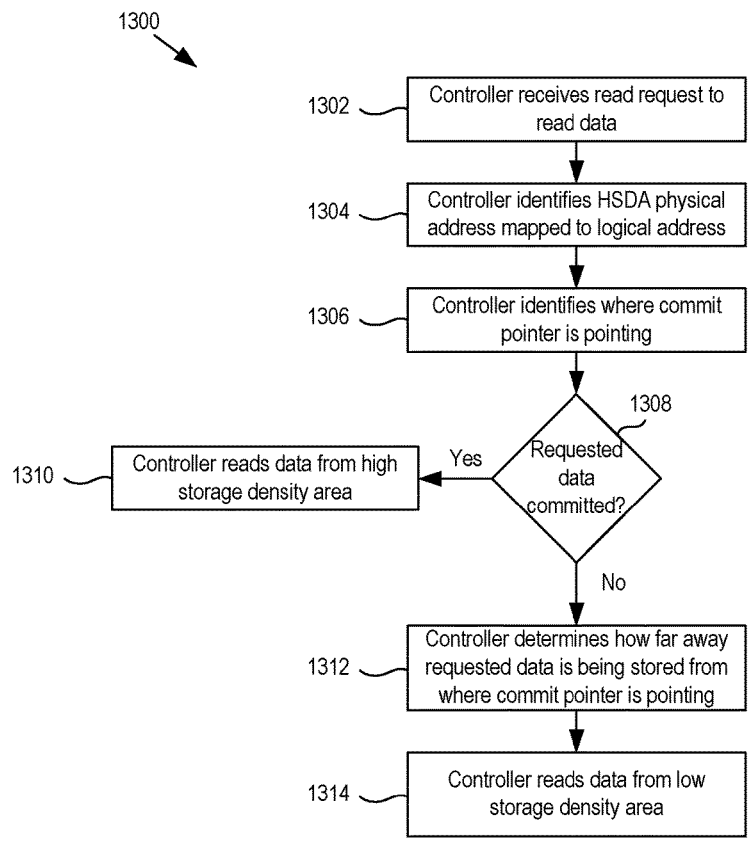
FIG. 13 is a flow chart of an example method of reading requested data in a memory system.

FIG. 13 shows a flow chart of an example method 1300 of reading requested data in a memory system, such as the memory system 100. At block 1302, a controller of the memory system (e.g., using the front end module 108) may receive a read request, such as from a host, to read data. The read request may include a logical address that indicates the data requesting to be read. The requested data may have been initially programmed in a low storage density area of a memory of the memory system, such as the low storage density area 602, and subsequently folded into a high storage density area of the memory, such as the high storage density area 604. The controller may have updated an address mapping database (e.g., the address mapping database 710) with a mapping that maps the logical address with a HSDA physical address identifying where in the high storage density area the data is being stored. The controller may not have updated the address mapping database with a mapping that maps the logical address with a LSDA physical address identifying where in the low storage density area the data is being stored.

At block 1304, the controller (e.g., using the read management module 902) may access the address mapping database with the logical address to identify the HSDA physical address. At block 1306, the controller (e.g., using the read management module 902) may determine where a commit pointer is pointing. At block 1308, the controller (e.g., using the read management module 902) may determine if the requested data is committed. The controller may do so by determining if the requested data is being stored within a region of the high storage density area that is storing committed data. The region may be identified by the commit pointer. At block 1310, if the controller determines that the requested data is committed, then the controller may read the data from the high storage density area.

Alternatively, if the controller determines that the requested data is not committed, then at block 1312, the controller (e.g., using the physical address translation module) may determine a storage offset corresponding to how far away (e.g., how many LSDA storage pages or wordlines away) the requested data is being stored from where a folded pointer is pointing based on the HSDA address mapped to the logical address. At block 1314, the controller may determine where in the low storage density area the folded pointer is pointing, and then determine where the requested data is being stored according to where the folded pointer is pointing and the storage offset. Upon determining where the requested data is being stored, the controller may then read the requested data from the low storage density area.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A memory system comprising:
   a memory comprising a first memory area and a second memory area, the first memory area comprising a lower storage density than the second memory area; and
   a controller configured to:
      program a first data set into a first storage location of the first memory area;
      in response to all of the first data set programmed into the first storage location of the first memory area, perform a first phase of a first write operation to store the first data set in a first storage location of the second memory area, the first storage location of the first memory area and the first storage location of the second memory area equal in storage capacity;
      program a second data set into a second storage location of the first memory area;
      in response to all of the second data set programmed into the second storage location of the first memory area:
         perform a first phase of a second write operation to store the second data set in a second storage location of the second memory area, the second storage location of the first memory area and the second storage location of the second memory area equal in storage capacity; and
         perform a second phase of the first write operation;
      program a third data set into a third storage location of the first memory area; and
      in response to all of the third data set programmed into the third storage location of the first memory area:
         perform a first phase of a third write operation to store the third data set in a third storage location of the second memory area, the third storage location of the first memory area and the third storage location of the second memory area equal in storage capacity;
         perform a second phase of the second write operation; and
         perform a third phase of the first write operation.

2. The memory system of claim 1, wherein the controller is further configured to:
   before performing a third phase of the third write operation to store the third data set in the third storage location of the second memory, perform a commit operation to commit the first data set and perform a third phase of the second write operation to storage the second data set in the second storage location of the second memory area.

3. The memory system of claim 1, wherein the first storage location of the second memory area, the second storage location of the second memory area, and the third storage location of the second memory area are adjacent storage locations of the second memory area.

4. The memory system of claim 1, wherein the first memory area and the second memory area are each partitioned into a first data type portion associated with a first data type and a second data type portion associated with a second data type, wherein the controller is further configured to:
- identify the first data set as being of the first data type or of the second data type;
- determine that the first storage location of the first memory area and the storage location of the second memory area are in the respective first data type portions in response to an identification that the first data set is of the first data type; and
- determine that the first storage location of the first memory area and the first storage location of the second memory area in the respective second data type portions in response to an identification that the first data set is of the second data type.

5. The memory system of claim 1, wherein the first storage location of the second memory area comprises a single storage page.

6. A folding method comprising:
- monitoring, with a controller of a system, an amount of a data set being stored in a storage location of a low storage density memory area of the memory system;
- determining, with the controller, that the amount of the data set has reached a threshold level;
- in response to the determining, outputting, with power control circuitry, an initial series of pulses of a first programming operation to program the amount of the data set in a storage location of a high storage density memory area of the memory system;
- determining, with the controller, to read the data set from the low storage density memory area in response to determining that the data set in the high storage density memory area is uncommitted instead of committed;
- in response to determining that the data set is uncommitted, identifying, with the controller, a storage location of the low storage density memory area where the data set is stored by identifying a number of storage locations away from where in the low storage density memory area a folded pointer is pointing; and
- retrieving, with the controller, the data set from the storage location of the low storage density memory area.

7. The method of claim 6, wherein the storage location of the low storage density memory area comprises a first storage location of the low storage density memory area, the storage location of the high storage density memory area comprises a first storage location of the high storage density memory area, the amount of the data set comprises a first amount of a first data set, the initial series of pulses comprises a first initial series of pulses, and wherein the method further comprises:
- monitoring, with the controller, a second amount of a second data set being stored in a second storage location of the low storage density memory area of the memory system;
- in response to the controller determining that the second amount of the second data set has reached the threshold level:
  - outputting, with the power control circuitry, an initial series of pulses of a second programming operation to program the second amount of the second data set in a second storage location of the high storage density memory area; and
  - outputting, with the power control circuitry, a second series of pulses of the first programming operation to program the first amount of the first data set in the first storage location of the high storage density memory area.

8. The method of claim 7, further comprising:
- monitoring, with the controller, a third amount of a third data set being stored in a third storage location of the low storage density memory area of the memory system;
- in response to the controller determining that the third amount of the third data set has reached the threshold level:
  - outputting, with the power control circuitry, an initial series of pulses of a third programming operation to program the third amount of the third data set in a third storage location of the high storage density memory area;
  - outputting, with the power control circuitry, a second series of pulses of the second programming operation to program the second amount of the second data set in the second storage location of the high storage density memory area; and
  - outputting, with the power control circuitry, a third series of pulses of the first programming operation to program the first amount of the first data set in the second storage location of the high storage density memory area.

9. The memory system of claim 8, wherein the first storage location of the second memory area, the second storage location of the second memory area, and the third storage location of the second memory area are adjacent storage locations of the second memory area.

10. The folding method of claim 6, wherein the storage location comprises a single page of the high storage density memory area.

11. A memory system comprising:
- a memory comprising a first memory area and a second memory area, the first memory area comprising a lower storage density than the second memory area;
- a controller configured to:
  - program a data set into the first memory area and the second memory area;
  - update an address data structure to identify the data set as being stored in the second memory area but not the first memory area; and
  - in response to a read request to read the data set from the memory:
    - determine whether the data set stored in the second memory area is committed or uncommitted;
    - in response to a determination that the data set stored in the second memory area is committed, read the data set from the second memory area; and
    - in response to a determination that the data set stored in the second memory area is uncommitted, read the data set from the first memory area.

12. The memory system of claim 11, wherein the controller is further configured to:
- identify where the data set is stored in the second memory area relative to a second memory area address to which a commit pointer is pointing in an address database in order to determine whether the data set stored in the second memory area is verified.

13. The memory system of claim 12, wherein the commit pointer points to an address of the second memory area where a last committed data set is stored.

14. The memory system of claim 12, wherein the data set comprises a first data set, and wherein the controller, in response to the determination that the first data set is uncommitted, is configured to identify where the first data set is stored in the second memory area in relation to where a second data set is stored in the second memory area, the second data set being identified as a last data set to have been programmed in the second memory area with a last phase of a multi-phase programming operation.

15. The memory system of claim 14, wherein the controller is configured to point a folded pointer to an address where the second data set is stored in the first memory area in response to the last phase of the multi-phase programming operation being performed.

16. The memory system of claim 14, wherein the controller is further configured to program a third data set into the second memory area, and before performing a last phase of a multi-phase programming operation to program the third data set into the memory area, perform a commit operation to commit the first data set and perform the last phase of the multi-phase programming operation to program the second data set into the memory operation.

17. A memory system comprising:
a memory comprising a first memory area and a second memory area, the first memory area comprising a lower storage density than the second memory area;
means for programming a first data set into a first storage location of the first memory area;
means for performing a first phase of a first write operation to store the first data set in the first storage location of the second memory area in response to all of the first data set programmed into the first storage location of the first memory area, the first storage location of the first memory area and the first storage location of the second memory area equal in storage capacity;
means for programming a second data set into a second storage location of the first memory area;
means for performing a first phase of a second write operation to store the second data set in a second storage location of the second memory area and for performing a second phase of the first write operation in response to all of the second data set programmed into the second storage location of the first memory area, the second storage location of the first memory area and the second storage location of the second memory area equal in storage capacity;
means for programming a third data set into a third storage location of the first memory area; and
means for performing a first phase of a third write operation to store the third data set in a third storage location of the second memory area, for performing a second phase of the second write operation, and for performing a third phase of the first write operation in response to all of the third data set programmed into the third storage location of the first memory area, the third storage location of the first memory area and the third storage location of the second memory area equal in storage capacity.

* * * * *